US 6,632,292 B1

United States Patent
Aegerter et al.

(10) Patent No.: US 6,632,292 B1
(45) Date of Patent: Oct. 14, 2003

(54) SELECTIVE TREATMENT OF MICROELECTRONIC WORKPIECE SURFACES

(75) Inventors: Brian K. Aegerter, Kalispell, MT (US); Curt T. Dundas, Kalispell, MT (US); Tom L. Ritzdorf, Big Fork, MT (US); Gary L. Curtis, Kila, MT (US); Michael Jolley, Beaverton, OR (US)

(73) Assignee: Semitool, Inc., Kalispell, MT (US)

( * ) Notice: Subject to any disclaimer, the term of this patent is extended or adjusted under 35 U.S.C. 154(b) by 92 days.

(21) Appl. No.: 09/672,572

(22) Filed: Sep. 28, 2000

Related U.S. Application Data

(63) Continuation of application No. 09/437,926, filed on Nov. 10, 1999, now Pat. No. 6,473,436, which is a continuation of application No. PCT/US99/05674, filed on Mar. 15, 1999, application No. 09/672,572, which is a continuation-in-part of application No. 09/437,711, filed on Nov. 10, 1999, now Pat. No. 6,423,642, which is a continuation of application No. PCT/US99/05676, filed on Mar. 15, 1999, application No. 09/672,572, which is a continuation-in-part of application No. 09/113,435, filed on Jul. 10, 1998, now Pat. No. 6,264,752, and a continuation-in-part of application No. 09/041,649, filed on Mar. 13, 1998, now Pat. No. 6,318,385, said application No. 09/113,435, is a continuation-in-part of application No. 09/041,901, filed on Mar. 13, 1998, now Pat. No. 6,350,319.

(60) Provisional application No. 60/117,474, filed on Jan. 27, 1999, and provisional application No. 60/116,750, filed on Jan. 23, 1999.

(51) Int. Cl.[7] .................................................. B08B 7/00

(52) U.S. Cl. ......................... 134/33; 134/2; 134/3; 134/26; 134/28; 134/32; 134/36; 134/41; 134/94.1; 134/95.1; 134/95.3; 134/99.1; 134/902; 216/13; 216/92; 216/101; 216/103; 216/105; 438/906

(58) Field of Search ............................ 134/2, 3, 26, 28, 134/33, 32, 36, 41, 94.1, 95.1, 95.3, 99.1, 902; 216/13, 92, 101, 103, 105; 438/906

(56) References Cited

U.S. PATENT DOCUMENTS 3,727,620 A 4/1973 Orr
3,953,265 A 4/1976 Hood (List continued on next page.)

FOREIGN PATENT DOCUMENTS

| JP | 59-208831 | 11/1984 |
| JP | 60-137016 | 7/1985 |
| JP | 61-196534 | 8/1986 |
| JP | 62-166515 | 7/1987 |
| JP | 63-185029 | 7/1988 |
| JP | 1-120023 | 5/1989 |

(List continued on next page.)

Primary Examiner—Randy Gulakowski
Assistant Examiner—M. Kornakov
(74) Attorney, Agent, or Firm—Christensen O'Connor Johnson Kindness PLLC

(57) ABSTRACT

This invention provides a process for treating a workpiece having a front side, a back side, and an outer perimeter. In accordance with the process, a processing fluid is selectively applied or excluded from an outer peripheral margin of at least one of the front or back sides or the workpiece. Exclusion and/or application of the processing fluid occurs by applying one or more processing fluids to the workpiece as the workpiece and corresponding reactor are spinning about an axis of rotation that is generally orthogonal to the center of the face of the workpiece being processed. The flow rate of the one or more processing fluids, fluid pressure, and/or spin rate are used to control the extent to which the processing fluid is selectively applied or excluded from the outer peripheral margin.

24 Claims, 28 Drawing Sheets

U.S. PATENT DOCUMENTS

| | | | |
|---|---|---|---|
| 4,132,567 A | 1/1979 | Blackwood | |
| 4,439,243 A | 3/1984 | Titus | |
| 4,439,244 A | 3/1984 | Allevato | |
| 4,544,446 A | 10/1985 | Cady | |
| 4,664,133 A | 5/1987 | Silvernail et al. | |
| 4,750,505 A | 6/1988 | Inuta et al. | |
| 4,779,877 A | 10/1988 | Shaw | |
| 4,790,262 A | 12/1988 | Nakayama et al. | |
| 4,838,289 A | 6/1989 | Kottman et al. | |
| 4,903,717 A | 2/1990 | Sumnitsch | |
| 4,962,049 A * | 10/1990 | Chang et al. | 438/771 |
| 4,982,215 A | 1/1991 | Matsuoka | |
| 4,982,753 A | 1/1991 | Grebinski, Jr. et al. | |
| 5,020,200 A | 6/1991 | Mimasaka | |
| 5,032,217 A | 7/1991 | Tanaka | |
| 5,040,484 A | 8/1991 | Mears et al. | |
| 5,075,256 A * | 12/1991 | Wang et al. | 438/716 |
| 5,117,769 A | 6/1992 | DeBoer | |
| 5,168,886 A | 12/1992 | Thompson et al. | |
| 5,209,180 A | 5/1993 | Shoda et al. | |
| 5,222,310 A | 6/1993 | Thompson et al. | |
| 5,224,503 A | 7/1993 | Thompson et al. | |
| 5,224,504 A | 7/1993 | Thompson et al. | |
| 5,349,978 A | 9/1994 | Sago et al. | |
| 5,361,449 A | 11/1994 | Akimoto | |
| 5,421,893 A | 6/1995 | Perlov | |
| 5,431,421 A | 7/1995 | Thompson et al. | |
| 5,445,172 A | 8/1995 | Thompson et al. | |
| 5,500,081 A | 3/1996 | Bergman | |
| 5,513,594 A | 5/1996 | McClanahan et al. | |
| 5,551,986 A | 9/1996 | Jain | |
| 5,591,262 A | 1/1997 | Sago et al. | |
| 5,616,069 A | 4/1997 | Walker et al. | |
| 5,666,985 A | 9/1997 | Smith, Jr. et al. | |
| 5,677,824 A | 10/1997 | Harashima et al. | |
| 5,678,116 A | 10/1997 | Sugimoto et al. | |
| 5,718,763 A | 2/1998 | Tateyama et al. | |
| 5,762,708 A | 6/1998 | Motoda et al. | |
| 5,762,751 A | 6/1998 | Bleck et al. | |
| 5,779,796 A | 7/1998 | Tomoeda et al. | |
| 5,815,762 A | 9/1998 | Sakai et al. | |
| 5,845,662 A | 12/1998 | Sumnitsch | |
| 5,860,640 A | 1/1999 | Marohl et al. | |
| 5,868,866 A | 2/1999 | Maekawa et al. | |
| 5,882,433 A | 3/1999 | Ueno | |
| 5,885,755 A | 3/1999 | Nakagawa et al. | |
| 5,890,269 A | 4/1999 | Gardner et al. | |
| 5,916,366 A | 6/1999 | Ueyama et al. | |
| 5,942,035 A | 8/1999 | Hasebe et al. | |
| 5,964,954 A * | 10/1999 | Matsukawa et al. | 134/6 |
| 5,997,653 A | 12/1999 | Yamasaka | |
| 6,059,985 A * | 5/2000 | Yoshimura et al. | 216/37 |
| 6,139,639 A | 10/2000 | Kitamura et al. | |
| 6,255,228 B1 * | 7/2001 | Rolfson | 438/758 |

FOREIGN PATENT DOCUMENTS

| | | |
|---|---|---|
| JP | 1-283845 | 11/1989 |
| JP | 4-94537 | 3/1992 |
| JP | 5-13322 | 1/1993 |
| JP | 5-21332 | 1/1993 |
| JP | 5-326483 | 12/1993 |
| JP | 6-45302 | 2/1994 |
| JP | 52-12576 | 1/1997 |

* cited by examiner

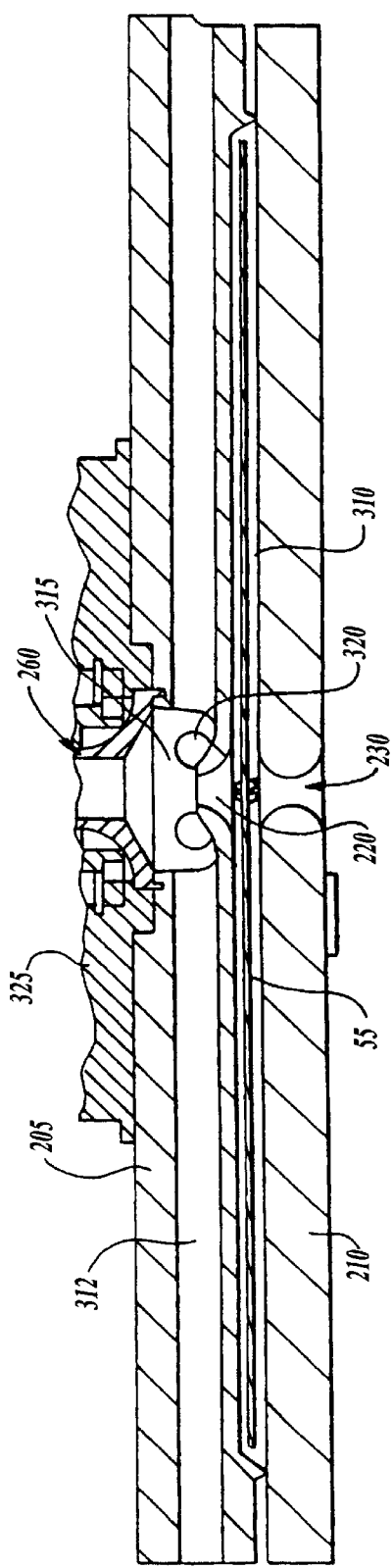
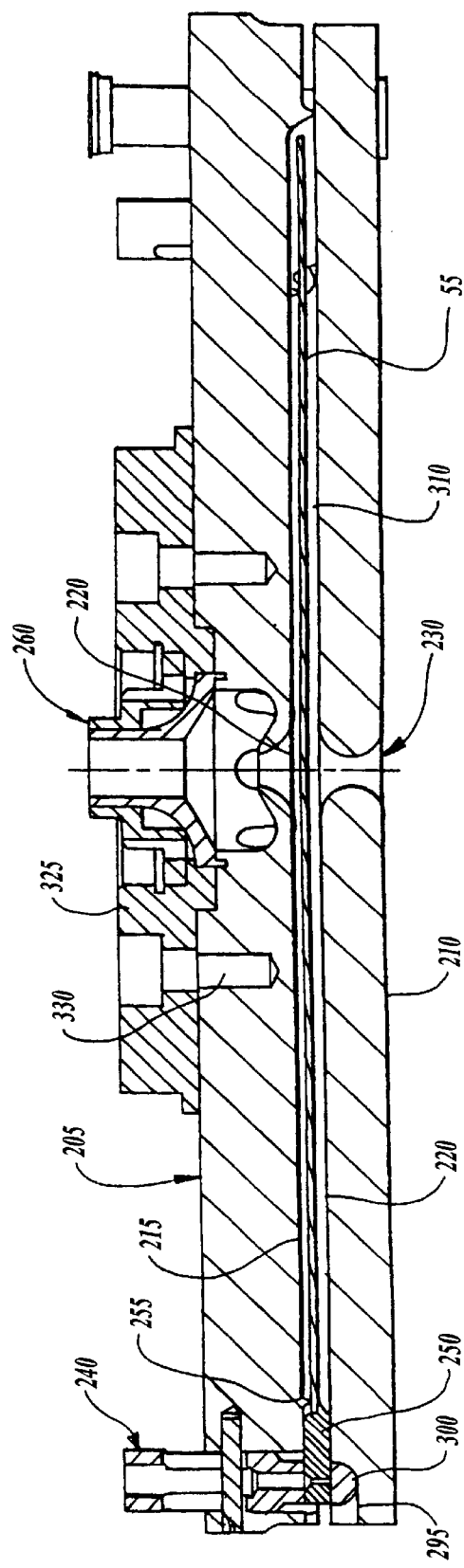
Fig. 7
Fig. 8

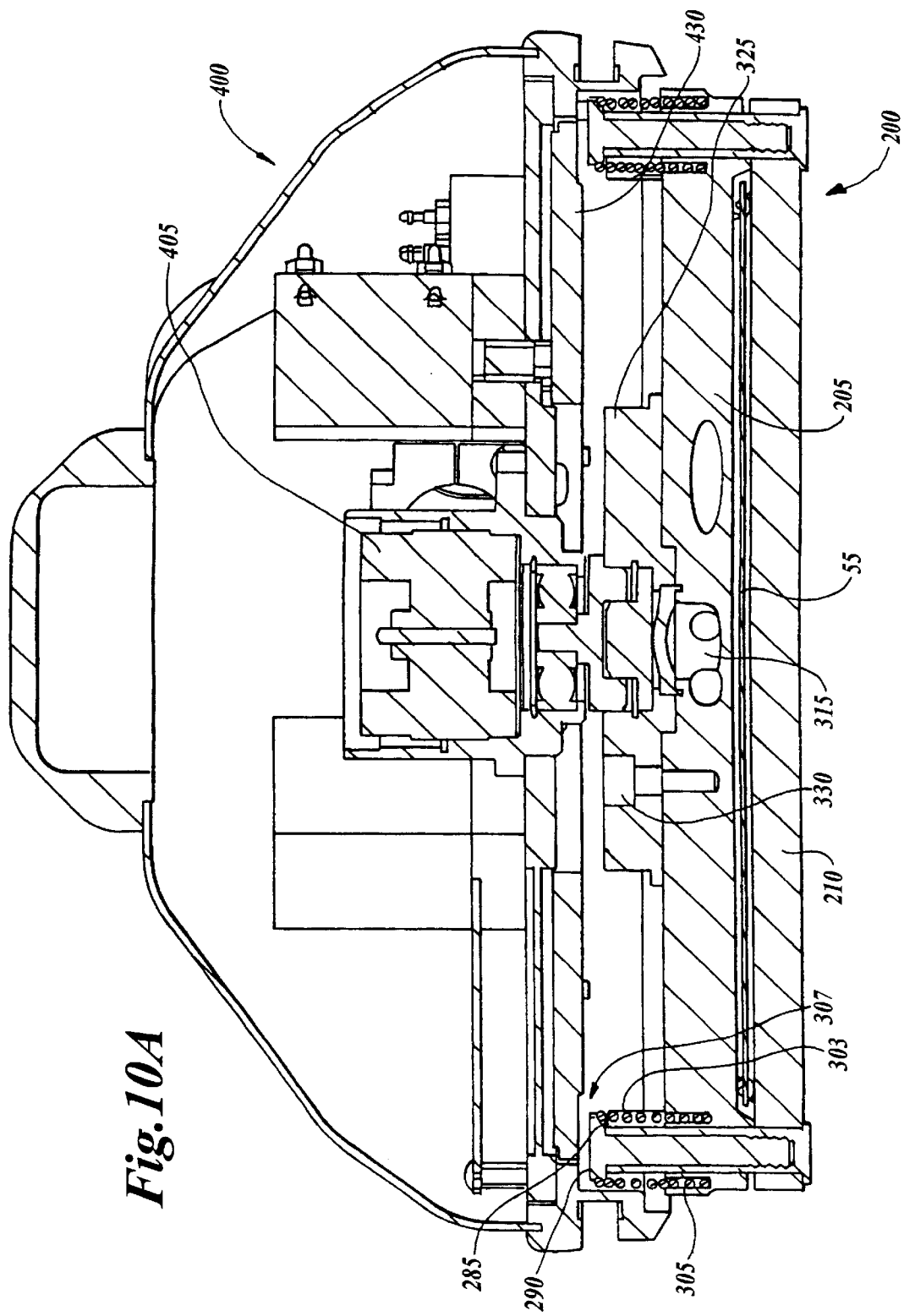

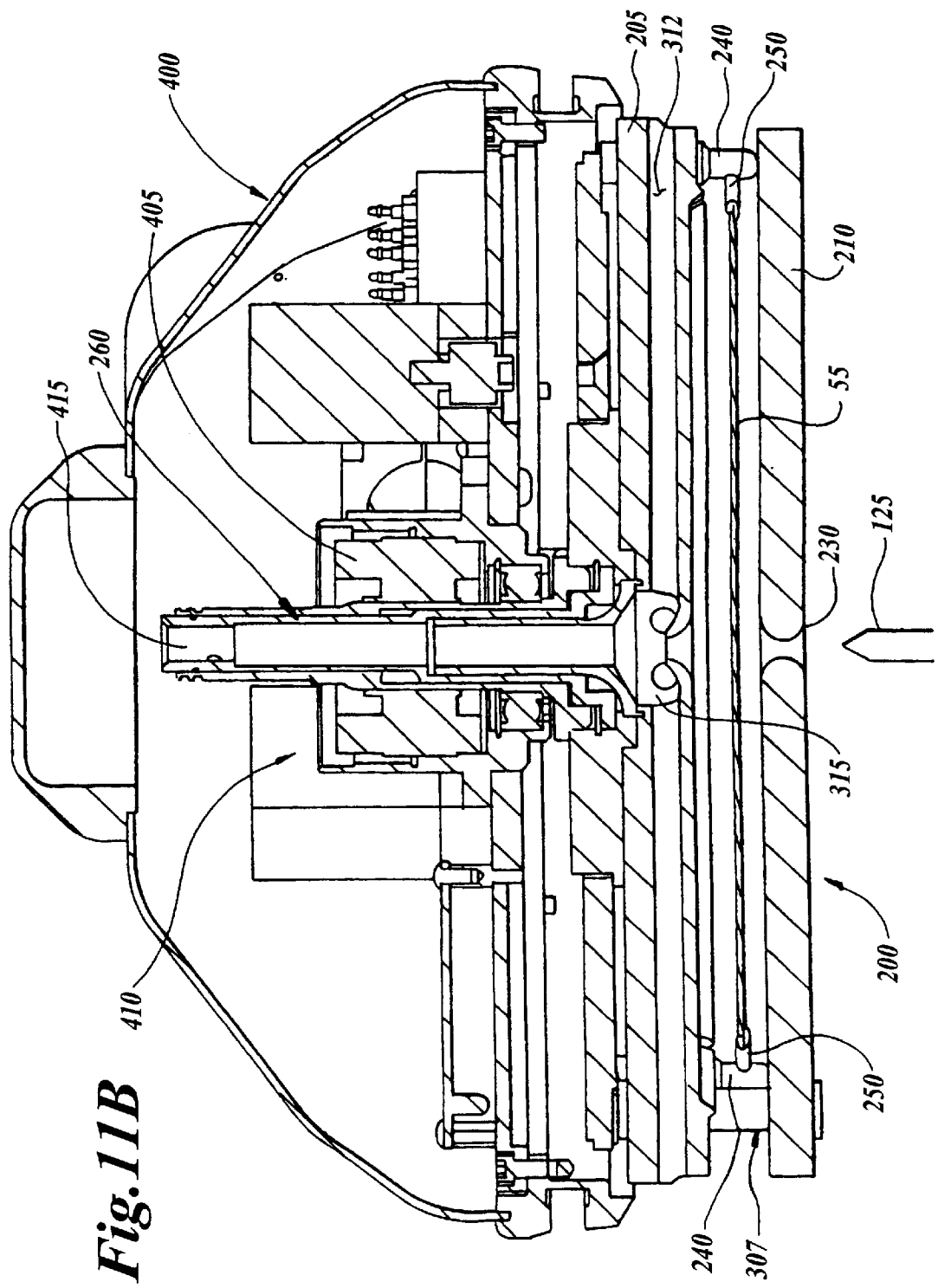

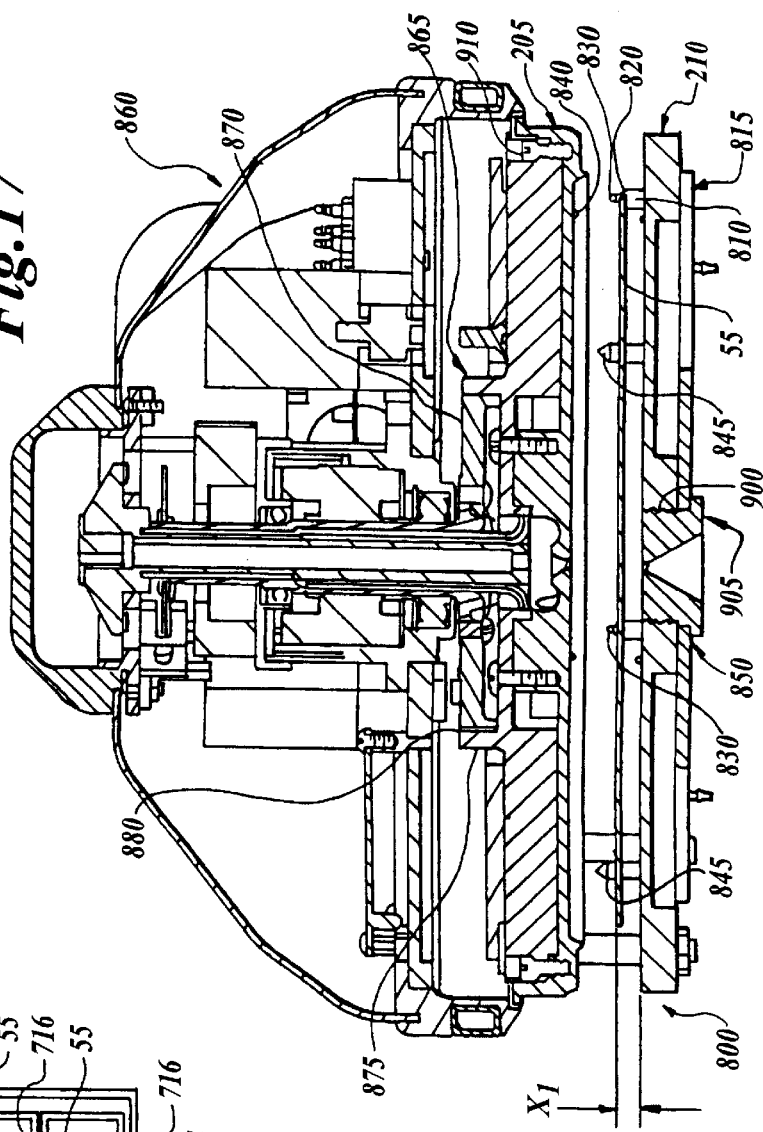
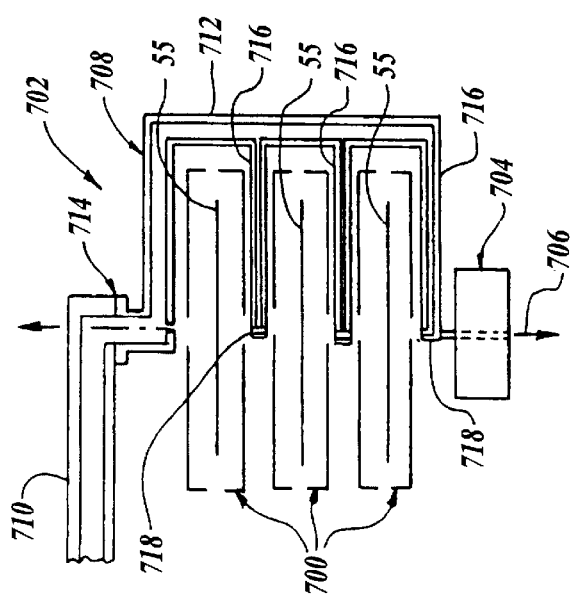
Fig. 17
Fig. 16

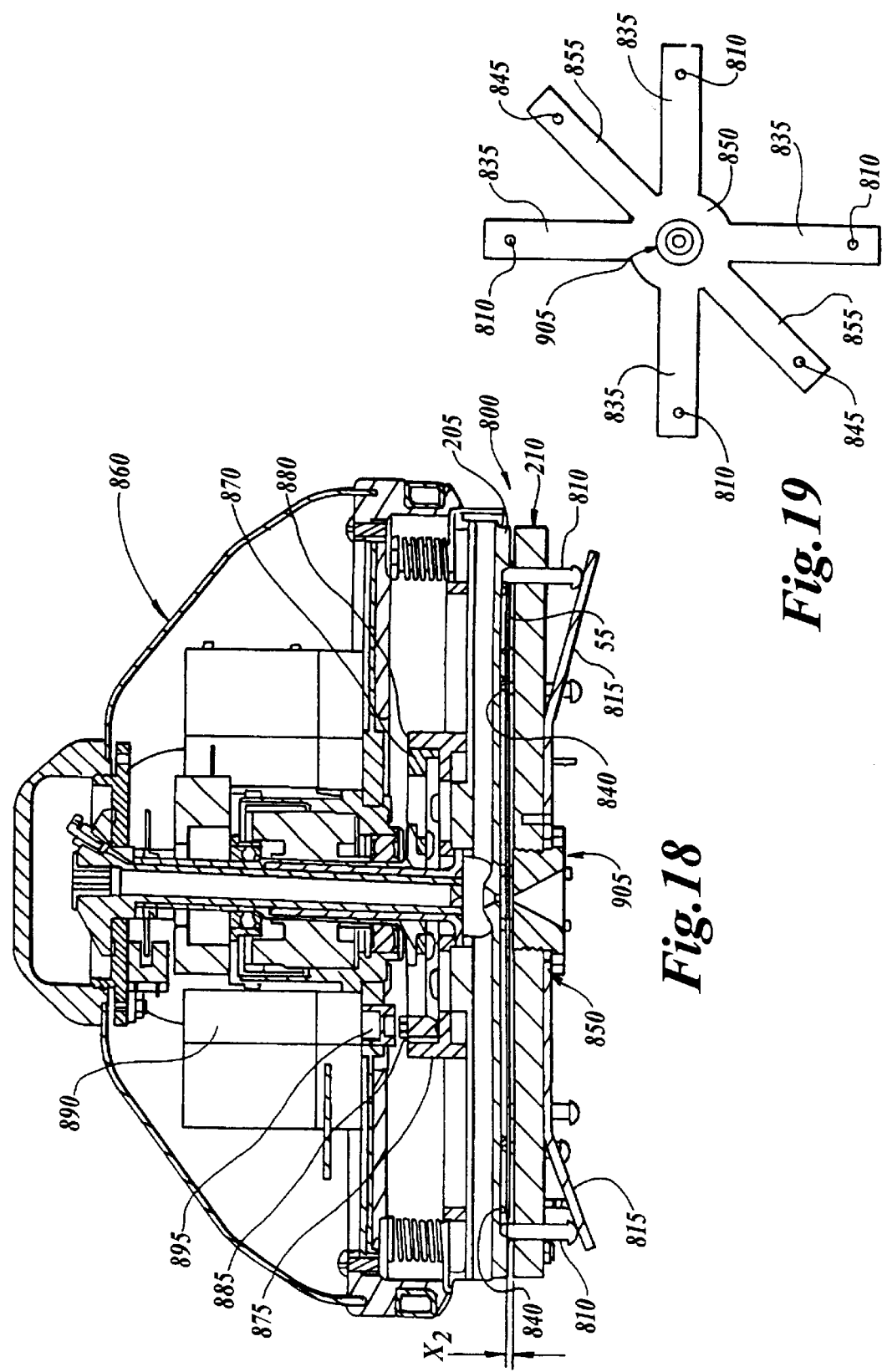

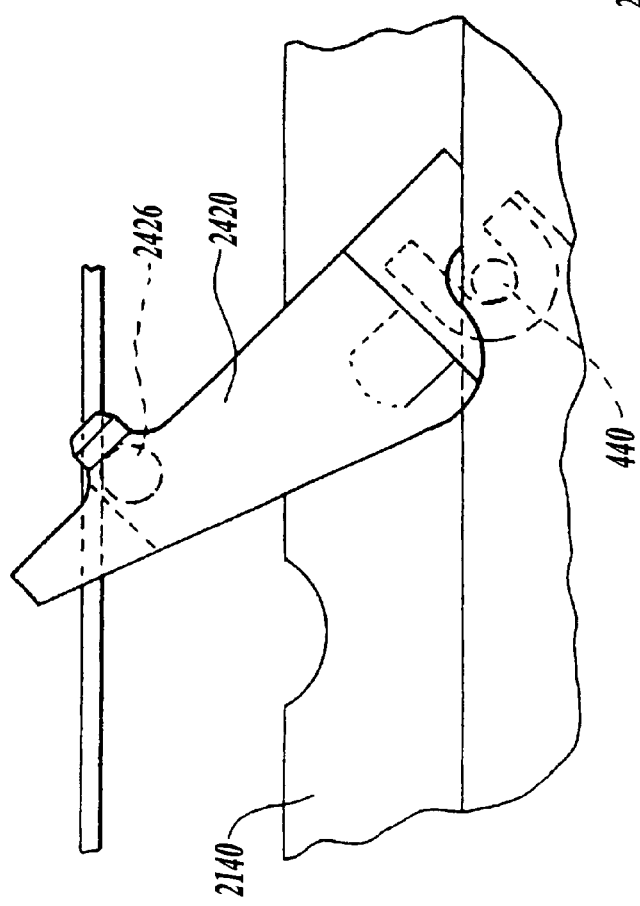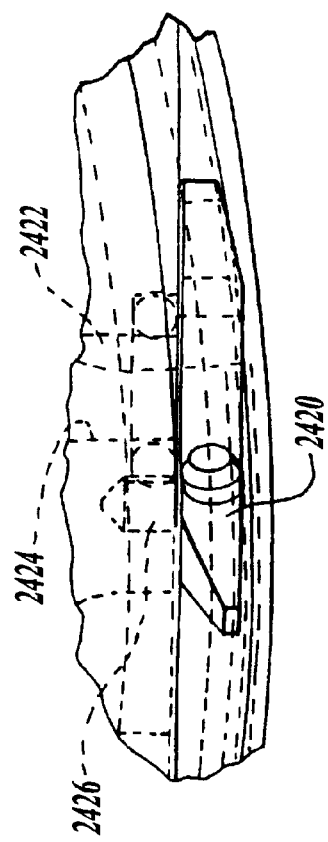

SELECTIVE TREATMENT OF MICROELECTRONIC WORKPIECE SURFACES

CROSS REFERENCE TO RELATED APPLICATIONS

The present application is a: continuation-in-part of U.S. patent application Ser. No. 09/437,926 filed Nov. 10, 1999 now U.S. Pat. No. 6,473,436, which is a continuation of International Patent Application No. PCT/US99/05674 filed Mar. 15, 1999 designating the U.S., which claims the benefit of U.S. Provisional Patent Application No. 60/117,474 filed Jan. 27, 1999; and is also a continuation-in-part of U.S. patent application Ser. No. 09/437,711 filed Nov. 10, 1999 now U.S. Pat. No. 6,423,642, which is a continuation of International Patent Application No. PCT/US99/05676 filed Mar. 15, 1999 designating the U.S., which claims the benefit of U.S. Provisional Patent Application No. 60/116,750 filed Jan. 23, 1999; and which is also a continuation-in-part of U.S. patent application Nos. 09/041,649 filed Mar. 13, 1998 now U.S. Pat. No. 6,378,385 and 09/113,435 filed Jul. 10, 1998 now U.S. Pat. No. 6,269,752, which is a continuation-in-part of 09/041,901 now U.S. Pat. No. 6,350,319 filed Mar. 13, 1998.

FIELD OF THE INVENTION

The present invention relates to the selective chemical processing of front side, back side and perimeter edge surfaces of microelectronic substrates.

BACKGROUND OF THE INVENTION

This invention pertains to treating a substrate such as a semiconductor wafer, e.g., a silicon wafer, so as to remove a thin film, such as a copper or other metal or oxide film, from selected regions on the wafer.

The fabrication of a microelectronic circuit and/or component from a substrate typically involves a substantial number of processes. Many of these processes involve the deposition of a thin film on the surface of the workpiece followed by contact with a processing liquid, vapor, or gas. In a known process for treating a microelectronic workpiece, such as a silicon wafer, on which microelectronic devices have been fabricated and which has a front, device side, a back, non-device side, and an outer perimeter, thin-film layers are successively applied and etched to form, for example, a metallized interconnect structure. In a typical metallization process, both sides of a semiconductor wafer are coated with a protective film such as a silicon nitride or a silicon oxide. Thereafter, a barrier layer such as titanium nitride, tantalum or tantalum nitride is applied over a dielectric layer on the front side of the workpiece. Depending upon the particular process used to form the interconnect structures, the dielectric layer may include a pattern of recessed micro-structures that define the various interconnect paths. A thin metal film, such as a copper film is applied exterior to the barrier layer. In most instances, the thin film serves as an initial seed layer for subsequent electroplating of a further metal layer, such as a further copper layer. Due to manufacturing constraints, the thin film is not applied over an outer, peripheral margin of the front side.

Known techniques, such as physical vapor deposition (sputtering) or chemical vapor deposition, are typically used to apply the barrier layer and the thin film. Both methods can deposit copper onto the wafer bevel (the peripheral edge of the wafer), and in many cases this deposit is non adherent and can flake off in subsequent processing steps such as annealing or CMP. After deposition of the barrier layer, additional layers may be deposited to the wafer front side edge. In instances in which a further metal layer is to be electroplated exterior to the thin film, one or more electrical contacts are connected to an outer margin of the thin film to provide plating power. Because subsequent layers are deposited with an edge exclusion, the previously deposited layers are left exposed. Many of these layers allow copper to be deposited on them, but the adhesion is very poor and flaking during post processing is observed. A typical copper example might be an exposed barrier layer such as Ti/TiN being exposed to copper plating solution. Following electrochemical deposition, the barrier layer would have a copper film of low quality which would flake off easily in CMP. Removal of flaking material before CMP processing is desirable as the flakes have the potential to cause scratches in the polished surface, resulting in yield losses.

The surface area of the front side beyond the inner boundary of the outer margin of the thin film is not available for fabricating the microelectronic devices since the present manufacturing processes limit the extent to which device structures can be formed at the outer margin. It would be highly desirable and would result in increased yield if more of the surface area beyond the present limits of the outer margin of the thin film were available for fabricating interconnect structures.

Covering the exposed barrier layer with a full coverage seed layer would eliminate copper metal from flaking off the barrier and also have the added benefit of increasing usable area on the wafer surface. Even in this case, copper deposited on the bevel during the seed layer and electrochemical deposition would need to be removed, as it too can flake off and/or cause cross contamination of metrology tools. A clear area inboard of the wafer bevel may also be necessary for reliable processing; many clamp rings are very sensitive to surface characteristics.

In the known process discussed above, and in other processes, contamination by copper, other metals, or other contaminants can occur on the back side of the workpiece. Although copper and other metals tend to diffuse rapidly through silicon or silicon dioxide, the back side is generally not provided with barrier layers that are capable of preventing copper, other metals, or other contaminants from diffusing through the silicon wafer to the front side, at which such contamination can be very detrimental to device performance.

Such contamination can result from overspraying or other processing artifacts or from cross-contamination via fabrication tools. Such contamination can occur on the outer perimeter of a silicon wafer as well as on its back side.

If not removed, such contamination can lead to cross-contamination of other wafers, via fabrication tools. Such contamination can be very difficult to remove, particularly if the contaminant has formed a stable silicide. It would be highly desirable if such contamination could be easily removed in a controlled manner without detrimentally affecting the front side of the workpiece.

SUMMARY OF THE INVENTION

The present invention provides processes for selectively treating surfaces of a workpiece having a first side, an opposing second side, and a peripheral edge defined between the perimeters of the first and second sides. In a first aspect of the present invention, a process is provided for applying a first fluid to the first side and peripheral edge of the workpiece, while excluding the first fluid from at least a majority of the second side of the workpiece. In a still further preferred embodiment, the first fluid is applied to the first side of the workpiece, the peripheral edge, and an outer perimeter portion of the second side of the workpiece. The first fluid preferably comprises an etchant to remove a metal film or oxide film from the exposed surface portions of the workpiece, to the exclusion of the remaining substantially non-exposed portion of the second side of the workpiece.

In a still further aspect of the present invention, a workpiece having a first side, an opposing second side, and a peripheral edge defined between the outer perimeters of the first side and the second side is received within a fluid chamber of a reactor. The fluid chamber has a first chamber portion which receives the first surface of the workpiece, and a second chamber portion which receives the second surface of the workpiece. A first fluid is supplied to the first chamber portion, in which the first side is exposed to the first fluid to the exclusion of the second side of the workpiece, which is not exposed in totality or to a predetermined extent to the first fluid. In the preferred embodiment, the first fluid includes an acid, preferably an inorganic acid, and an oxidizer that act on the first side to remove a metal film or oxide film therefrom, while not substantially affecting the second side of the workpiece or a selected portion of a second side of the workpiece. In addition to or in lieu of supplying the first fluid, a second fluid may optionally be supplied to the second chamber portion of the reactor, so that the second side of the workpiece or a selected portion of the second side of the workpiece is exposed to the second fluid. The second fluid may be a different process fluid such as an inert gas or liquid, a diluent or rinsing agent or other fluid.

The present invention thus provides a method and apparatus for selectively exposing a second side of a workpiece, such as a back side of a semiconductor wafer, to an etchant solution preferably including an etchant solvent, such as an acid, and optionally, an oxidizer, to remove a metal film, an oxide film or particulates from the back side of the wafer. The present invention also provides for exposure of the peripheral edge of the workpiece, such as the bevel edge of a semiconductor wafer, to the etchant solution to remove a metal film or oxide film from the bevel edge. Additionally, the processes and apparatus of the invention may be utilized to etch, remove, or reduce a metal film or an oxide film from a perimeter edge portion of the opposing second side of the workpiece, such as a narrow annular exclusion zone bordering the perimeter edge of the front (i.e., device) side of a semiconductor wafer. The selective exposures of surfaces of the workpiece are made without substantial exposure of the remainder of the second side of the workpiece, i.e., in the preferred embodiment, the device or front side of the semiconductor wafer. While the first fluid is supplied to the first side of the workpiece, the opposing second side of the workpiece may be exposed to no fluid, or may alternately be exposed to a purge fluid such as an inert gas or deonized water, or to another process fluid.

The present invention also provides semiconductor wafers and other workpieces produced from these processes.

The present invention also provides etchant solutions including an inorganic acid and ozone as an oxidizer, preferably hydrofluoric acid and ozone.

In a still further aspect of the invention, a processing fluid is selectively applied or excluded from an outer peripheral margin of at least one of the front or back sides of the workpiece. Exclusion and/or application of the processing fluid occurs by applying one or more processing fluids to the workpiece as the workpiece and corresponding reactor are spinning about an axis of rotation that is generally parallel (or antiparallel) to the vector defining the face of the workpiece being processed. The flow rate of the one or more processing fluids, fluid pressure, and/or spin rate are used to control the extent to which the processing fluid is selectively applied or excluded from the outer peripheral margin.

In a further aspect of the invention, a thin film is applied over the front side and over at least a portion of the outer perimeter. Usually, a barrier layer is applied over the front side and over at least a portion of the outer perimeter, whereupon a further thin film, such as a conductive seed layer, is applied over the barrier layer.

In a preferred embodiment, after one or more further intervening steps, such as electroplating of a metal layer onto the conductive seed layer, an etchant capable of removing one or more of the thin film layers is caused to flow over an outer margin of the front side while the etchant is prevented from flowing over the front side except for the outer margin. Thus, the etchant only contacts the outer margin of the front side thereby selectively removing only the one or more thin film layers from the outer margin of the front side. If the etchant is also caused to flow over the back side and over the outer perimeter, as well as over the outer margin of the front side, the one or more thin film layers are removed from the outer perimeter and any contaminant that the etchant is capable of removing is stripped from the back side as well.

Rather than an etchant, a cleaning chemical can be used in some applications to remove or dissolve the one or more thin film layers as described above.

BRIEF DESCRIPTION OF THE DRAWINGS

The foregoing aspects and many of the attendant advantages of this invention will become more readily appreciated as the same become better understood by reference to the following detailed description, when taken in conjunction with the accompanying drawings, wherein:

FIG. 7 is a cross-sectional view of the workpiece housing taken along line IV—IV of FIG. 6.

FIG. 8 is a cross-sectional view of the workpiece housing taken along line V—V of FIG. 6.

FIGS. 10A and 10B are cross-sectional views showing the workpiece housing in a closed state and connected to a rotary drive assembly.

FIGS. 11A and 11B are cross-sectional views showing the workpiece housing in an open state and connected to a rotary drive assembly.

FIG. 16 illustrates a batch wafer processing tool constructed in accordance with the principles of the present invention.

FIG. 17 illustrates a further embodiment of a reactor including features that render it well-suited for integration with workpiece transfer automation equipment, wherein the reactor is in an open state for loading/unloading a workpiece that is to be processed.

FIG. 18 illustrates the embodiment of the reactor of FIG. 17 wherein the reactor is in a closed processing state.

FIG. 19 illustrates one embodiment of a biasing member that may be used in the reactor of FIG. 17.

FIGS. 28 and 29 are further enlarged details of one lifting lever, as seen in two different positions.

DETAILED DESCRIPTION OF PREFERRED EMBODIMENTS OF THE INVENTION

Although the process of the present invention has applicability to any process in which a processing fluid is selectively provided to or excluded from an outer margin of an electrochemically processed workpiece, the present invention is particularly well suited for removal of a film, or a portion of a film, that has been deposited on a substrate by electrolytic or electroless processing, specifically metal films and oxide films. Thus the invention is suitably used for removing or decreasing the thickness of metal films from select surfaces of a workpiece, including by way of non-limiting example, films containing copper, copper alloys such as copper zinc, neon, zinc, chromium, tin, gold, silver, lead, cadmium, platinum, palladium, iridium, or rubidium. Such metal films are typically removed using solutions applied in accordance with the present invention, including an etchant such as an acid and preferably an oxidizing agent, as shall be described further subsequently. Oxide films can also be suitably removed in whole or in part in accordance with the present invention, including metal oxides, silicon oxides, and barrier and protective layers, such as by way of nonlimiting examples, silicon nitride, silicon oxide, polysilicon, tantalum nitride, and titanium nitride. The term "film" and "contaminant" are used interchangeably herein. However, the term "workpiece" is not limited to semiconductor wafers, but rather refers to substrates having generally parallel planar first and second surfaces and that are relatively thin, including semiconductor wafers, ceramic wafers, and other substrates upon which microelectronic circuits or components, data storage elements or layers, and/or micromechanical elements are formed.

A preferred embodiment of the invention will be described in connection with a sequence of processing steps for depositing one or more metallization layers or metallized structures on a semiconductor workpiece, with it being understood that the invention is adaptable for use with other workpieces and films.

A. Semiconductor Workpiece Processing

Figure 1A:
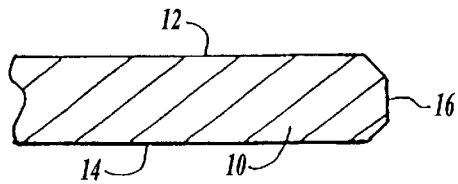
FIGS. 1A, 1B, 1C, and 1D are fragmentary, cross-sectional views of a microelectronic workpiece, such as a silicon wafer, at various stages of a known sequence of processing steps in accordance with prior art.
Figure 1B:
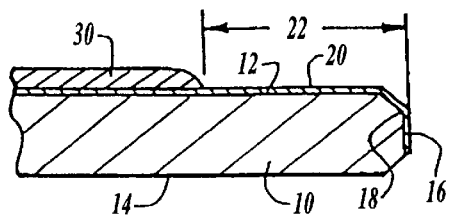
Figure 2B:
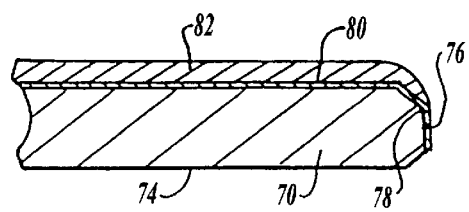

The known sequence of processing steps in accordance with the prior art begins with a semiconductor wafer 10, on which microelectronic devices (not shown) have been fabricated. As illustrated in FIG. 1A, the wafer 10 has a front, device side 12, a back, non-device side 14, and a beveled, outer perimeter 16. Via physical vapor deposition (sputtering) or chemical vapor deposition, a barrier layer 20 is applied over the front side 12 and over an upper portion 18 of the outer perimeter 16. A thin-film seed layer, such as a copper film 30, is applied over the barrier layer 20. Conventionally, the seed layer 30 is only deposited within the bounds of an outer margin 22 of the barrier layer 20, as illustrated in FIG. 1B. At an outer edge 32 of the copper film 30, one or more electrical contacts 40 to be used in providing electroplating power to the seed layer are placed in electrical contact with the copper film 30, as illustrated in FIG. 1C.

Figure 1C:
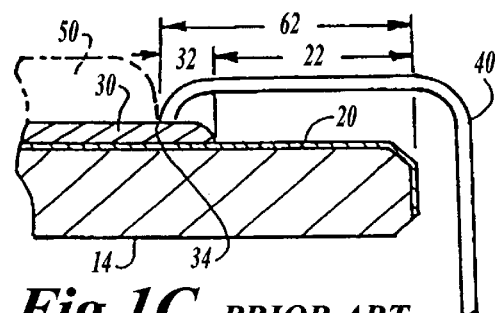
Figure 1D:
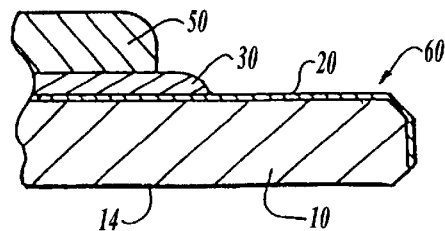

After the one or more electrical contacts 40 have been connected to the seed layer copper film 30 a further copper layer 50 from which interconnect structures and/or metallized devices are fabricated is electroplated onto the wafer 110 as illustrated in FIG. 1C. The electrical contact(s) 40 are then removed to provide the resultant multi film structure, shown generally at 60 in FIG. 1D. Beyond an inner boundary 34 of the outer margin 32 of the copper layer 50, an annular region 62 of the front side 12 is not available for fabricating such interconnect structures or metallized devices.

Figure 2A:
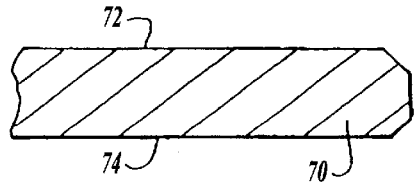
FIGS. 2A, 2B, 2C, and 2D are fragmentary, cross-sectional views of a microelectronic workpiece, such as a silicon wafer, at various stages of a novel sequence of processing steps in accordance with this invention.
Figure 2C:
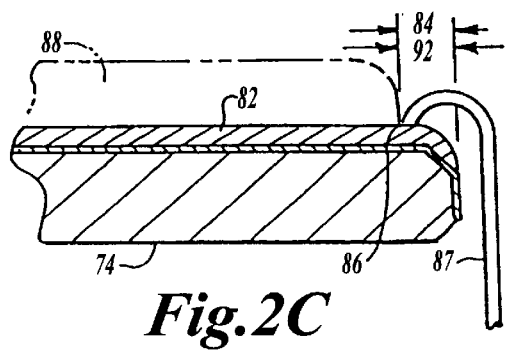

One example of novel sequence of processing steps in accordance with the present invention begins with a silicon wafer 70, which is similar to the silicon wafer 10 before processing, on which microelectronic devices (not shown) have been fabricated, and which has a front, device side 72, a back, non-device side 74, and a beveled, outer perimeter 76, as illustrated in FIG. 2A. Via physical vapor deposition (sputtering) or chemical vapor deposition, a barrier layer 80 is applied over the front side 72 and over an upper portion 78 of the outer perimeter 76 and a thin seed layer, such as a copper film 82 is applied over the entire barrier layer 80, without exclusion from a peripheral outer margin 86, so as to cover the barrier layer 80 where applied over the front side 72 and over the upper portion 78 of the outer perimeter 76, as illustrated in FIG. 1B. At an outer edge 84 of the copper seed layer 82, one or more electrical contacts 87 to be used in electroplating are connected to provide electroplating power to the copper film 82, as illustrated in FIG. 2C. As illustrated, the outer edge 84 at which contact may be made for the supply of electroplating power illustrated in FIG. 2C is substantially closer to the peripheral edge than the process as illustrated in FIG. 1C.

Figure 2D:
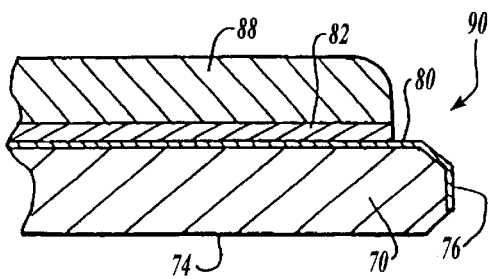

A further copper film 88 from which metallized interconnects and/or microelectronic devices are fabricated is then applied using an electrochemical deposition process. As illustrated in FIG. 2C, the further copper film 88 is deposited within the outer margin 92 of the copper film 82. The electrical contact 86 is then removed leaving the resultant multi-layer structure shown generally at 90 of FIG. 2D. Metallized devices (not shown) and/or interconnects are formed by known techniques, from the resultant structure 90. After the copper layer 88 has been deposited, the seed layer 82, film 88, and/or barrier layer 80 may be removed from the outer margin 84 and, if desired peripheral edge 76 of the workpiece 70. Removal of at least layer 82 from the outer margin assists in preventing film flaking and cross-contamination problems that may occur during subsequent workpiece processing.

In accordance with an embodiment the process, processing fluid is selectively applied to the outer peripheral margin of at least the front side of the workpiece. Exclusion and/or application of the processing fluid occurs by applying one or more processing fluids to the workpiece as the workpiece and corresponding reactor are spinning about an axis of rotation that is generally aligned on the central orthogonal axis of the face of the workpiece being processed. The flow rate of the one or more processing fluids, fluid pressure, and/or spin rate are used to control the extent to which the processing fluid is selectively applied to the outer peripheral margin.

A reactor suitable for executing the foregoing removal process may generally be comprised of upper and lower members that define an upper chamber and a lower chamber with respect to the workpiece contained therein. A centrally disposed inlet is provided to each of the upper an lower chambers for supplying one or more processing fluids. Fluid outlets are disposed at peripheral portions of the chambers and are adapted to assist in the exclusion of one processing fluid from the outer margin of the workpiece while allowing intrusion of an etchant thereat. The upper and lower chambers are rotated conjointly so as to distribute a processing fluid in the upper chamber across an upper side of the workpiece through centripetal acceleration and so as to distribute a processing fluid in the lower chamber across a lower side of the workpiece through centripetal acceleration. Depending upon the processes being performed, however, the processing fluids in the upper and lower chambers may be the same fluid or different fluids.

Also, rather than relying on the rotation of the workpiece, the processing fluid could also be selectively driven by pumps.

Through control of the respective pressures of the processing fluids entering the respective chambers and of the rotational speed of the rotating chambers, it is possible to control the reactor so as to cause the processing fluid entering the inlet of the lower chamber to flow over the near side of the wafer, over the outer perimeter of the workpiece, and over an outer margin of the far side of the workpiece, and so as to prevent the same processing fluid from flowing over the far side except for the outer margin. The control of the fluid pressures may be achieved for example through the use of a pump for liquids, or a pressure regulator for a pressurized gas source.

B. Process Overview

The present invention provides processes for selectively removing a film, such as a metal film or oxide film, from selected surface portions of a semiconductor workpiece. The metal film or oxide film can be selectively removed from: a single side of the workpiece; the peripheral edge of the workpiece; the peripheral edge and back side of the workpiece; the peripheral edge and an exclusion zone defined by a narrow annular perimeter edge portion of the front side of the workpiece; or the back side, peripheral edge and exclusion zone. To remove such films, such as metal contaminants that are not desired on the peripheral edge and/or the back side, an etchant solution is utilized which first oxidizes the metal and then solubilizes the oxidized metal to remove it from the selected surface portion. Oxide films may likewise be removed from selected surfaces of the workpiece using an acidic etchant. While the back side and/or peripheral edge is being etched, the front or device side of the semiconductor wafer may be left unprocessed, or may be exposed to an inert material such as a purge gas (e.g., nitrogen or helium), to a rinse such as deionized water, or to another processing fluid such as a more highly diluted etchant. The front side of the wafer (excluding the exclusion zone) is either left unprocessed, or is processed to a lesser degree without damage to the underlying devices, metal interconnects or semiconductor layers.

The processes of the present invention are adapted for many types of processes, including the removal of metal films such as copper ion contamination that is deposited on the peripheral bevel edge or the back side of a wafer during previous processing steps. For example, copper ion contamination can be removed from the bevel edge and back side, and additionally bulk copper can be selectively removed by a reduction in thickness from all areas of the substrate including the front or device side, to a predetermined extent. While reference is made herein to treating a bevel edge, it should also be understood that the methods of the present invention are adaptable for treating non-beveled edges such as flatted edges of semiconductor wafers.

In addition to copper removal, other examples of uses for the processes and apparatus of the present invention are, without limitation: the removal of cobalt contaminants from the back side and/or bevel edge of the wafer; the removal of contaminant particles from the back side of a semiconductor wafer prior to photo-lithography; the removal of residue remaining after dry plasma etching of the front side of the front side of a semiconductor wafer; the oxide etching of one or both sides and/or the peripheral edge of a semiconductor wafer; the etching of silicon nitride from one or both sides of the peripheral edge of a semiconductor wafer, and other processing techniques where it is desirable to selectively remove a metal or oxide film from surfaces. Other uses of the processes of the present invention include removal of noble metals (Pt, Pd, Ru, Ir); and removal of metallic oxides such as high K dielectrics (BST, SBT, $Ta_2O_5$) from the backside and peripheral edge.

Before describing these processes in detail, suitable equipment for carrying out the processes of the present invention are first described.

C. Apparatus

Figure 3:
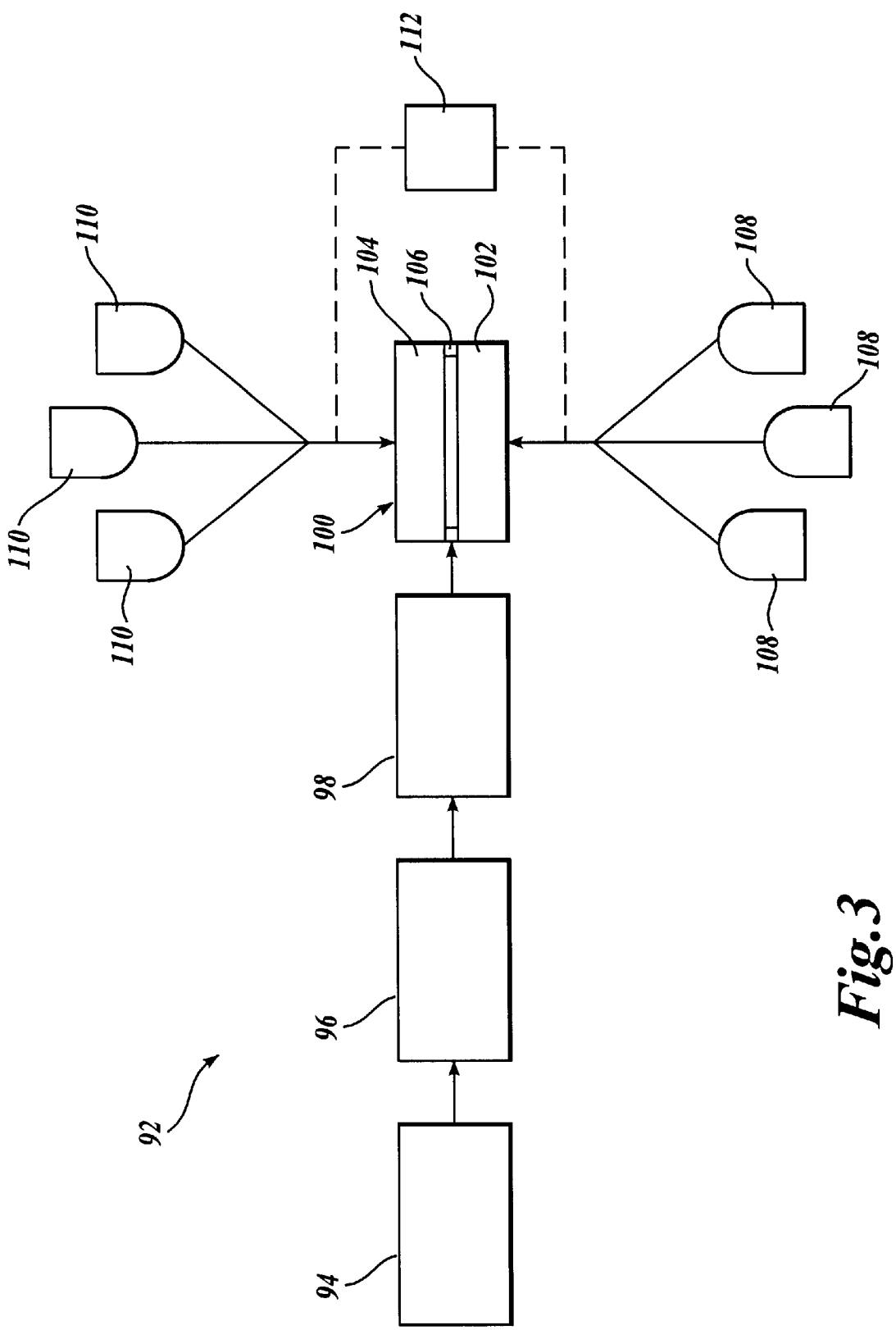
FIG. 3 is a schematic representation of a system in which the processes of the present invention can be implemented.

A system 92 useful for carrying out the processes of the present invention is illustrated in FIG. 3. FIG. 3 includes one or more preprocessing stations 94, in which a substrate that is to be electrochemically processed is prepared. In the case of a semiconductor wafer, the processing station 94 may be a chemical vapor deposition or physical vapor deposition station, such as for applying a barrier layer to a workpiece. The thusly prepared workpiece is then moved to one or more further processing stations 96, where, for example, a thin metal film such as a seed layer may be deposited on the substrate. Additional process steps may be incorporated as required to complete preparation of the workpiece for electrochemical treatment, such as the application of a metal film. The workpiece then is passed, either manually or under automated control, to a reactor 98, in which the metal film is to be deposited. In the case of a semiconductor wafer this may be an electroplating reactor 98, in which metal is deposited over the seed layer to the front or device side of the wafer, with potential contamination of the bevel edge and back side of the wafer.

The semiconductor wafer is then moved to an etching reactor 100, in which the surfaces of the workpiece are to be selectively treated to remove metal film or oxide film. In the preferred embodiment, the reactor 100 provides for selective etching of the back side, bevel edge and/or perimeter exclusion zone of a semiconductor wafer. The workpiece is received within a chamber defined within the reactor 100, with a first side of the workpiece being exposed to a lower chamber portion 102 and a second side of the workpiece being exposed to an upper chamber portion 104. The terms "upper" and "lower" are used herein for convenience, and other orientation are also encompassed by the invention.

The perimeter edge of the workpiece may be sealed, or may be in communication with fluid outlets at a perimeter edge portion 106 of the reactor. The side of the workpiece exposed to the lower chamber 102 may then be selectively supplied with one or more fluids from fluid supplies 108, such as deionized water for rinsing, chemical solution for etching or other processing, or an inert fluid such as nitrogen. In addition to or in lieu of fluids being supplied from the supplies 108 to the lower chamber 102, one or more fluids may be selectively supplied from one or more fluid supplies 110 to the upper chamber 104. Again, fluid supplies 110 may supply a chemical processing fluid, deionized water, or purge gas such as nitrogen. Supply of the various fluids is controlled by a programmable controller 112 that operates valves or pumps supplying the various fluids. In accordance with the present invention, fluid may be supplied only to one side of the workpiece, such as a chemical solution provided to etch the back side and/or peripheral edge, with no fluid being supplied to the opposing second side of the workpiece. In the preferred embodiment, however, while the first side is being supplied with a chemical solution, the second side is being supplied with an inert gas or deionized water rinse, or an alternate processing solution. After etching, the etched side of preferably both sides of the wafer are supplied with deionized water rinse, spun to remove fluids, and dried with heated nitrogen.

Various configurations of reactors may be utilized for carrying out the selective treatment of the present invention. By way of example, the processes provided by this invention can be advantageously practiced in one of a variety of reactors illustrated and described in U.S. patent application Ser. Nos. 09/437,711 filed Nov. 10, 1999 and 09/437,926 filed Nov. 10, 1999, the disclosures of which are hereby incorporated herein by reference.

Figure 4:
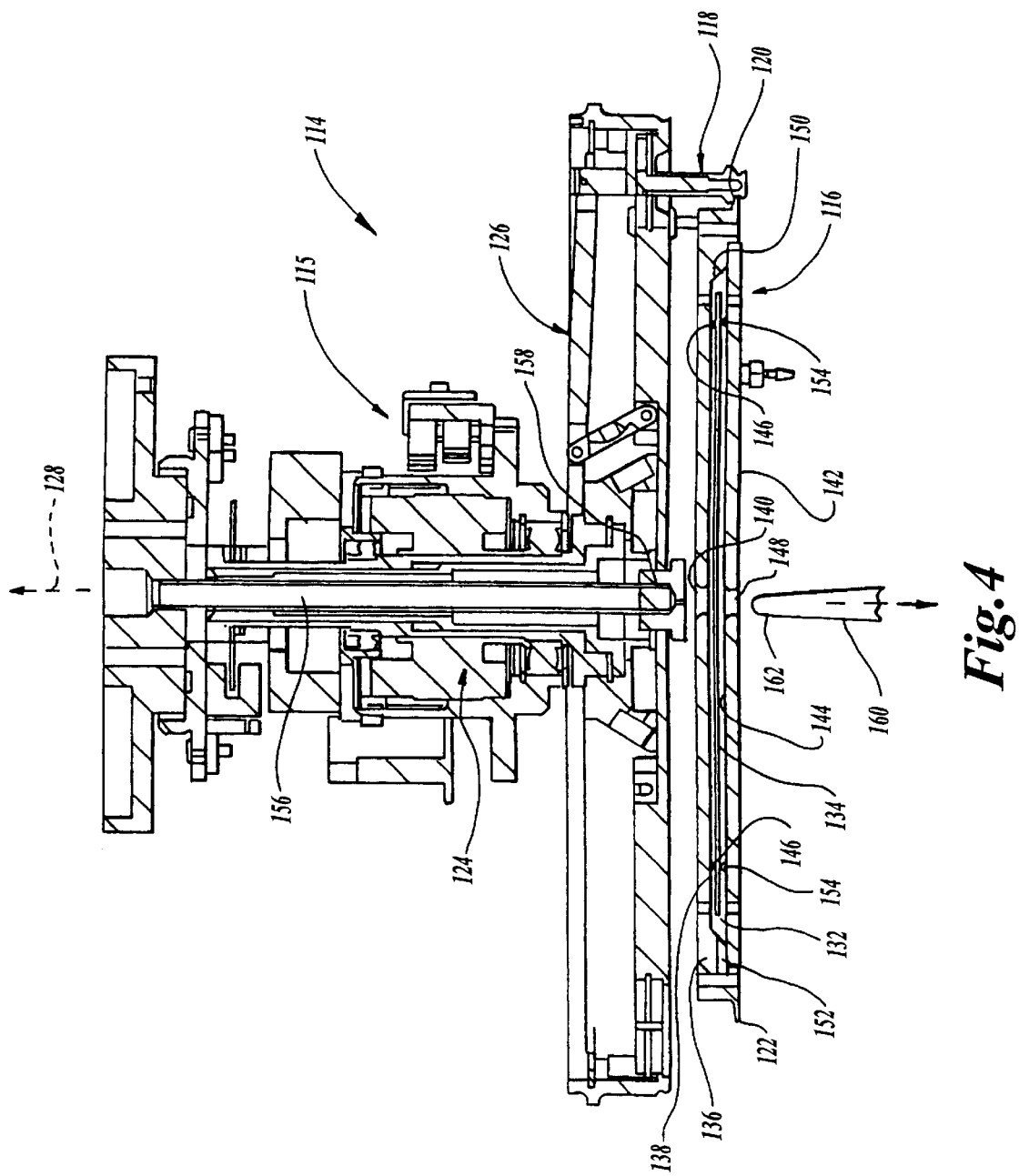
FIG. 4 is a cross-sectional view of a microelectronic workpiece housing and a rotor assembly constructed for use in accordance with one embodiment of the invention.

FIG. 4 is a cross-sectional view of one suitable embodiment of a reactor, shown generally at 114, constructed in accordance with the teachings of the present invention. The embodiment of the reactor 114 of FIG. 4 is generally comprised of a rotor portion 115 and a microelectronic workpiece housing 116. The rotor portion 115 includes a plurality of support members 118 that extend downwardly from the rotor portion 115 to engage the workpiece housing 116. Each of the support members 118 includes a groove 120 that is dimensioned to engage a radially extending flange 122 that extends about a peripheral region of the workpiece housing 116. Rotor portion 115 further includes a rotor motor assembly 124 that is disposed to rotate a hub portion 126, including the support members 118, about a central axis 128. Workpiece housing 116 is thus secured for co-rotation with hub portion 130 when support members 118 are engaged with flange 122. Other constructions of the rotor portion 115 and the engagement mechanism used for securement with the workpiece housing 116 may also be used.

The workpiece housing 116 of the embodiment of FIG. 4 defines a substantially closed processing chamber 132. Preferably, the substantially closed processing chamber 132 is formed in the general shape of the microelectronic workpiece 134 and closely conforms with the surfaces of the workpiece. The specific construction of FIG. 1 includes an upper chamber member 136 having an interior chamber face 138. The upper chamber member 136 includes a centrally disposed fluid inlet opening 140 in the interior chamber face 138. The specific construction also includes a lower chamber member 142 having an interior chamber face 144. The lower chamber member 142 has a centrally disposed fluid inlet opening 148 in the interior chamber face 144. The upper chamber member 136 and the lower chamber member 146 engage one another to define the processing chamber 132. The upper chamber member 136 includes sidewalls 150 that project downward from the interior chamber face 138. One or more outlets 152 are disposed at the peripheral regions of the processing chamber 132 through the sidewalls 150 to allow fluid within the chamber 132 to exit therefrom through centripetal acceleration that is generated when the housing 116 is rotated about axis 128.

In the illustrated embodiment, the microelectronic workpiece 134 is a generally circular wafer having upper and lower planar surfaces. As such, the processing chamber 132 is generally circular in plan view and the interior chamber faces 138 and 144 are generally planar and parallel to the upper and lower planar surfaces of the workpiece 134. The spacing between the interior chamber faces 138 and 144 and the upper and lower planar surfaces of the workpiece 134 is generally quite small. Such spacing is preferably minimized to provide substantial control of the physical properties of a processing fluid flowing through the interstitial regions.

The wafer 134 is spaced from the interior chamber face 144 by a plurality of spacing members 154 extending from the interior chamber face 144. Preferably, a further set of spacing members 146 extend from the interior chamber face 138 and are aligned with the spacing members 152 to grip the wafer 134 therebetween.

Fluid inlet openings 140 and 148 provide communication passageways through which one or more processing fluids may enter the chamber 132 for processing the wafer surfaces. In the illustrated embodiment, processing fluids are delivered from above the wafer 134 to inlet 140 through a fluid supply tube 156 having a fluid outlet nozzle 158 disposed proximate inlet 140. Fluid supply tube 156 extends centrally through the rotor portion 115 and is preferably concentric with the axis of rotation 128. Similarly, processing fluids are delivered from below the wafer 134 to inlet 148 through a fluid supply tube 160. Fluid supply tube 160 terminates at a nozzle 162 disposed proximate inlet 148. Although nozzles 158 and 162 terminate at a position that is spaced from their respective inlets, it will be recognized that tubes 156 and 160 may be extended so that gaps are not present. Rather, nozzles 158 and 162 or tubes 156 and 160 may include rotating seal members that abut and seal with the respective upper and lower chamber members 136 and 146 in the regions of the inlets 140 and 148. In such instances, care should be exercised in the design of the rotating joint so as to minimize any contamination resulting from the wear of any moving component.

During processing, one or more processing fluids are individually or concurrently supplied through fluid supply tubes 156 and 160 and inlets 140 and 148 for contact with the surfaces of the workpiece 134 in the chamber 132. Preferably, the housing 116 is rotated about axis 128 by the rotor portion 115 during processing to generate a continuous flow of any fluid within the chamber 132 across the surfaces of the workpiece 134 through the action of centripetal acceleration. Processing fluid entering the inlet openings 140 and 148 are thus driven across the workpiece surfaces in a direction radially outward from the center of the workpiece 134 to the exterior perimeter of the workpiece 134. At the exterior perimeter of the workpiece 134, any spent processing fluid is directed to exit the chamber 132 through outlets 166 as a result of the centripetal acceleration. Spent processing fluids may be accumulated in a cup reservoir disposed below and/or about the workpiece housing 116. As will be set forth below in an alternative embodiment, the peripheral regions of the workpiece housing 116 may be constructed to effectively separate the processing fluids provided through inlet 140 from the processing fluids supplied through inlet 148 so that opposite surfaces of wafer 134 are processed using different processing fluids. In such an arrangement, the processing fluids may be separately accumulated at the peripheral regions of the housing 116 for disposal or re-circulation.

In the embodiment of FIG. 4, the workpiece housing 116 may constitute a single wafer pod that may be used to transport the workpiece 134 between various processing stations and/or tools. If transport of the housing 116 between the processing stations and/or tools takes place in a clean room environment, the various openings of the housing 116 need not be sealed. However, if such transport is to take place in an environment in which wafer contaminants are present, sealing of the various housing openings should be effected. For example, inlets 140 and 148 may each be provided with respective polymer diaphragms having slits disposed therethrough. The ends of fluid supply tubes 156 and 160 in such instances may each terminate in a tracor structure that may be used to extend through the slit of the respective diaphragm and introduce the processing fluid into the chamber 132. Such tracor/slitted diaphragm constructions are used in the medical industry in intravenous supply devices. Selection of the polymer material used for the diaphragms should take into consideration the particular processing fluids that will be introduced therethrough. Similar sealing of the outlets 166 may be undertaken in which the tracor structures are inserted into the diaphragms once the housing 116 is in a clean room environment.

Alternatively, the outlets 166 themselves may be constructed to allow fluids from the processing chamber to exit therethrough while inhibiting the ability of fluids to proceed from the exterior of housing 116 into chamber 132. This effect may be achieved, for example, by constructing the openings 152 as nozzles in which the fluid flow opening has a larger diameter at the interior of chamber 132 than the diameter of the opening at the exterior of the housing 116. In a further construction, a rotational valve member may be used in conjunction with the plurality of outlets 166. The valve member, such as a ring with openings corresponding to the position of outlets 166, would be disposed proximate the opening 166 and would be rotated to seal with the outlets 166 during transport. The valve member would be rotated to a position in which outlets 166 are open during processing. Inert gas, such as nitrogen, can be injected into the chamber 132 through supply tubes 156 and 160 immediately prior to transport of the housing to a subsequent tool or processing station. Various other mechanisms for sealing the outlets 166 and inlets 140 and 148 may also be employed.

Figure 5:
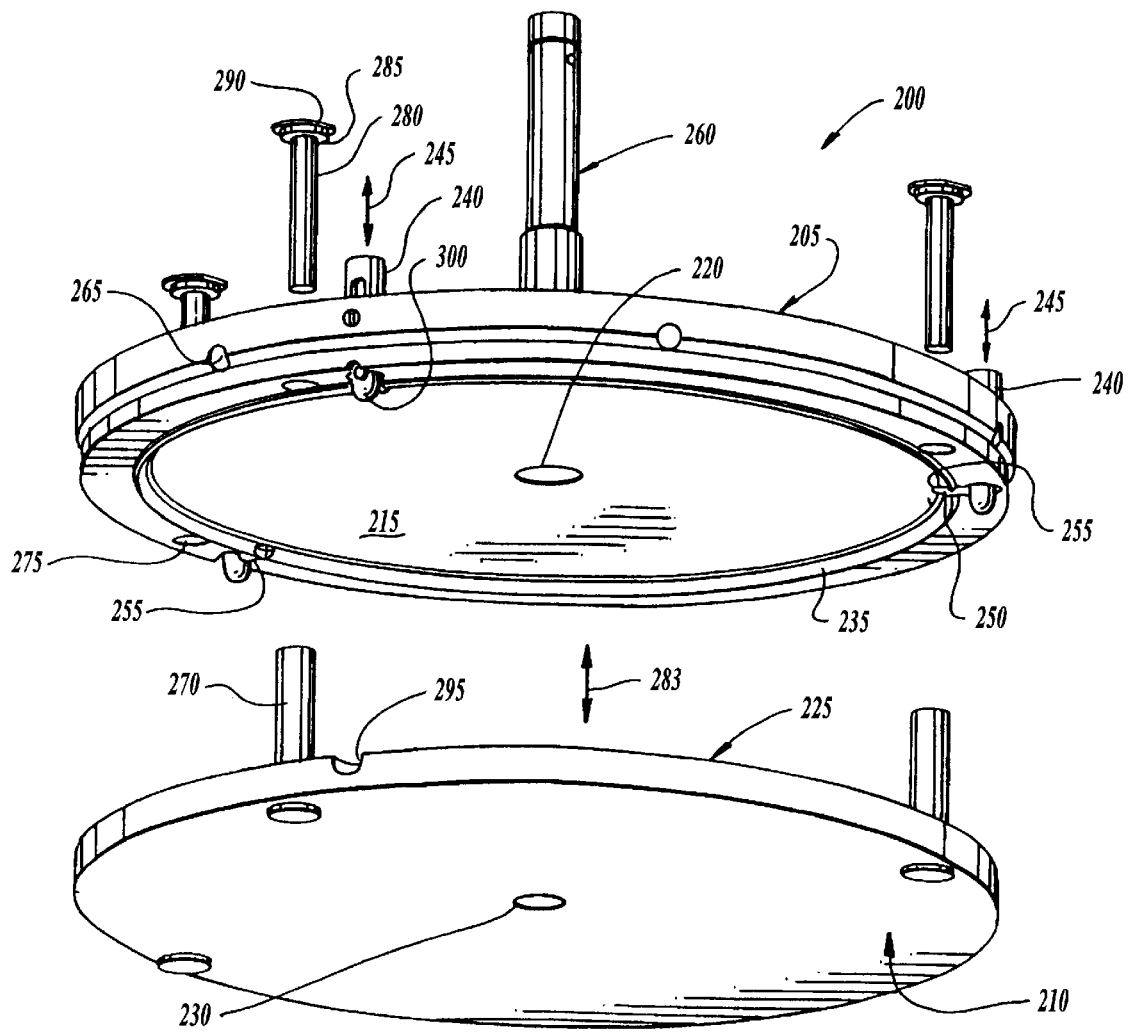
FIG. 5 is an exploded view of a further embodiment of a microelectronic workpiece housing constructed in accordance with the teachings of the present invention

FIG. 5 is a perspective view of a further reactor construction wherein the reactor is disposed at a fixed processing station and can open and close to facilitate insertion and extraction of the workpiece. The reactor, shown generally at 200, is comprised of separable upper and lower chamber members, 205 and 210, respectively. As in the prior embodiment, the upper chamber member 205 includes a generally planar chamber face 215 having a centrally disposed inlet 220. Although not shown in the view of FIG. 5, the lower chamber member 210 likewise has a generally planar interior chamber face 225 having a central inlet 230 disposed therethrough. The upper chamber member 205 includes a downwardly extending sidewall 235 that, for example, may be formed from a sealing polymer material or may be formed integrally with other portions of member 205.

The upper and lower chamber members, 205 and 210, are separable from one another to accept a workpiece therebetween. With a workpiece disposed between them, the upper and lower chamber members, 205 and 210, move toward one another to form a chamber in which the workpiece is supported in a position in which it is spaced from the planar interior chamber faces 215 and 225. In the embodiment of the reactor disclosed in FIGS. 5–11B, the workpiece, such as a semiconductor wafer, is clamped in place between a plurality of support members 240 and corresponding spacing members 255 when the upper and lower chamber members are joined to form the chamber (see FIG. 10B). Axial movement of the upper and lower chamber members toward and away from each other is facilitated by a plurality of fasteners 307, the construction of which will be described in further detail below. Preferably, the plurality of fasteners 307 bias the upper and lower chambers to a closed position such as illustrated at FIG. 10A.

In the disclosed embodiment, the plurality of wafer support members 240 extend about a peripheral region of the upper chamber member 205 at positions that are radially exterior of the sidewall 235. The wafer support members 240 are preferably disposed for linear movement along respective axes 245 to allow the support members 240 to clamp the wafer against the spacing members 255 when the upper and lower chamber members are in a closed position (see Fig. 10A), and to allow the support members 240 to release the wafer from such clamping action when the upper and lower chamber members are separated (see FIG. 11A). Each support member 240 includes a support arm 250 that extends radially toward the center of the upper chamber member 205. An end portion of each arm 250 overlies a corresponding spacing member 255 that extends from the interior chamber face 215. Preferably, the spacing members 255 are each in the form of a cone having a vertex terminating proximate the end of the support arm 250. Notches 295 are disposed at peripheral portions of the lower chamber member 210 and engage rounded lower portions 300 of the wafer support members 240. When the lower chamber member 210 is urged upward to the closed position, notches 295 engage end portions 300 of the support members 240 and drive them upward to secure the wafer 55 between the arms 250 of the supports 240 and the corresponding spacing members 255. This closed state is illustrated in FIG. 8. In the closed position, the notches 295 and corresponding notches 296 of the upper chamber member (see FIG. 5) provide a plurality of outlets at the peripheral regions of the reactor 200. Radial alignment of the arm 250 of each support member 240 is maintained by a set pin 308 that extends through lateral grooves 309 disposed through an upper portion of each support member.

Figure 9:
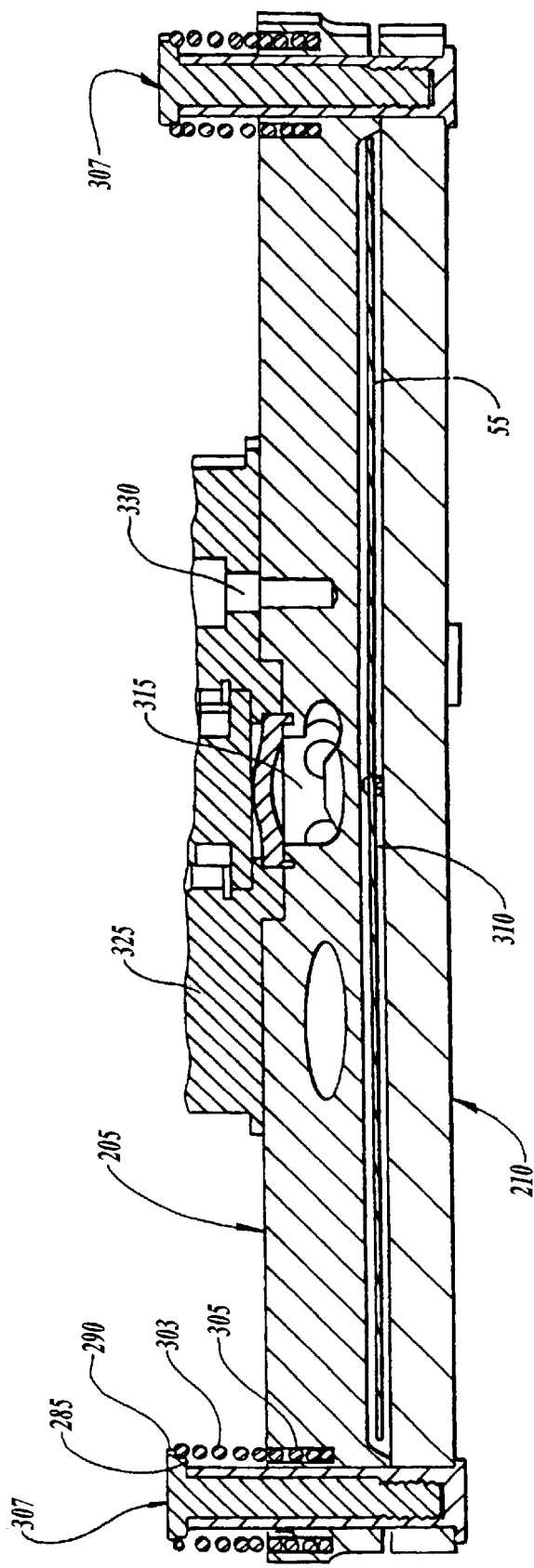
FIG. 9 is a cross-sectional view of the workpiece housing taken along line VI—VI of FIG. 6.
Figure 10B:
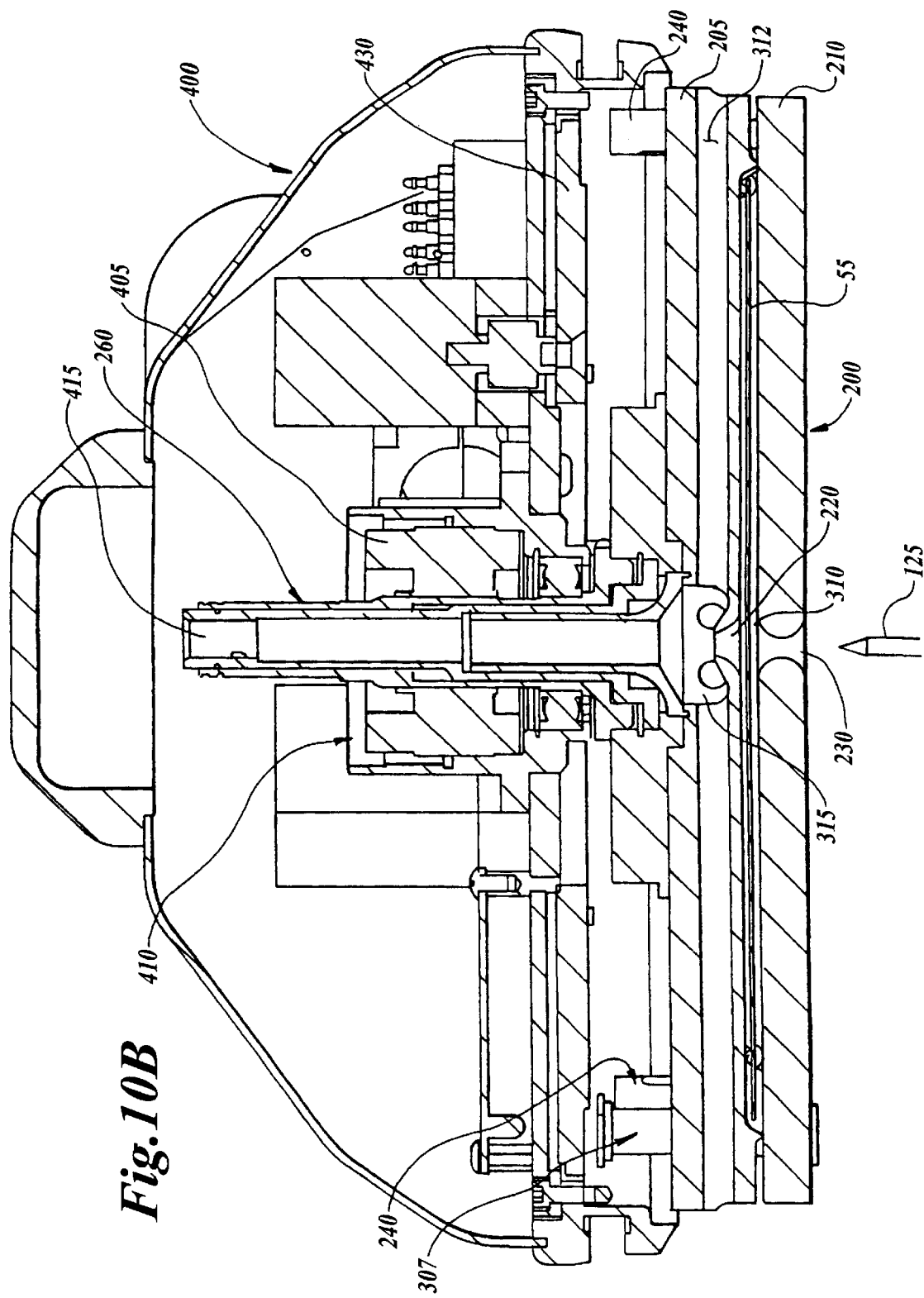

The construction of the fasteners 307 that allow the upper and lower chamber members to be moved toward and away from one another is illustrated in FIGS. 5, 9 and 10B. As shown, the lower chamber member 210 includes a plurality of hollow cylinders 270 that are fixed thereto and extend upward through corresponding apertures 275 at the peripheral region of the upper chamber member 205 to form lower portions of each fastener 307. Rods 280 extend into the hollow of the cylinders 270 and are secured to form an upper portion of each fastener 307. Together, the rods 280 and cylinders 270 form the fasteners 307 that allow relative linear movement between the upper and lower chamber members, 205 and 210, along axis 283 between the open and closed position. Two flanges, 285 and 290, are disposed at an upper portion of each rod 280. Flange 285 functions as a stop member that limits the extent of separation between the upper and lower chamber members, 205 and 210, in the open position. Flanges 290 provide a surface against which a biasing member, such as a spring (see FIG. 9) or the like, acts to bias the upper and lower chamber members, 205 and 210, to the closed position.

With reference to FIG. 9, the spring 303 or the like, has a first end that is positioned within a circular groove 305 that extends about each respective fastener 307. A second end of each spring is disposed to engage flange 290 of the respective fastener 307 in a compressed state thereby causing the spring to generate a force that drives the fastener 307 and the lower chamber member 210 upward into engagement with the upper chamber member 205.

The reactor 200 is designed to be rotated about a central axis during processing of the workpiece. To this end, a centrally disposed shaft 260 extends from an upper portion of the upper chamber member 205. As will be illustrated in further detail below in FIGS. 10A–11B, the shaft 260 is connected to engage a rotary drive motor for rotational drive of the reactor 200. The shaft 260 is constructed to have a centrally disposed fluid passageway (see FIG. 7) through which a processing fluid may be provided to inlet 220. Alternatively, the central passageway may function as a conduit for a separate fluid inlet tube or the like.

Figure 6:
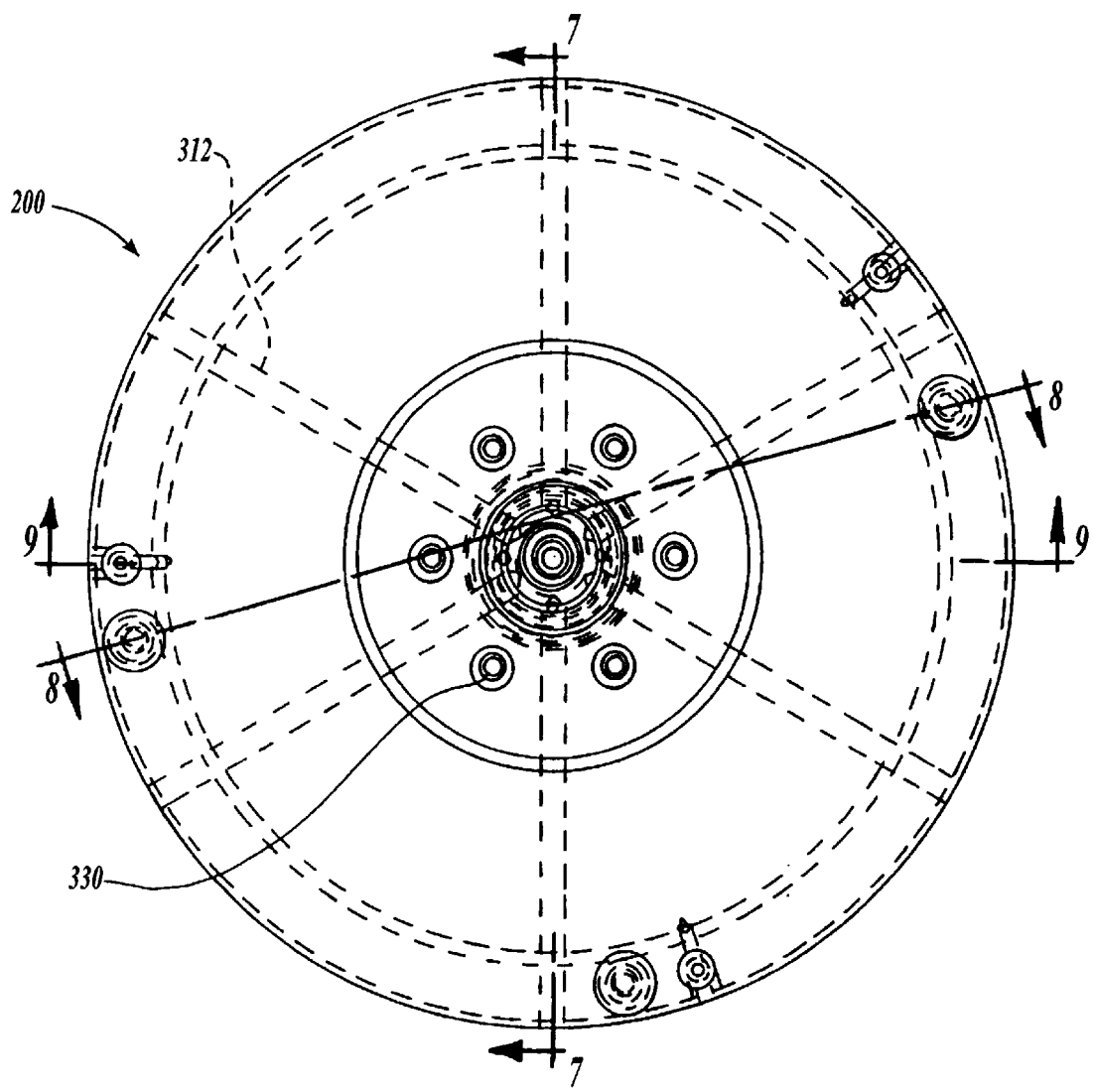
FIG. 6 is a top plan view of the workpiece housing of FIG. 5 when the housing is in an assembled state.

As illustrated in FIGS. 6 and 7, a plurality of optional overflow passageways 312 extend radially from a central portion of the upper chamber member 205. Shaft 260 terminates in a flared end portion 315 having inlet notches 320 that provide fluid communication between the upper portion of processing chamber 310 and the overflow passageways 312. The flared end 315 of the shaft 260 is secured with the upper chamber member 205 with, for example, a mounting plate 325. Mounting plate 325, in turn, is secured to the upper chamber member 205 with a plurality of fasteners 330 (FIG. 8). Overflow passages 312 allow processing fluid to exit the chamber 310 when the flow of fluid to the chamber 310 exceeds the fluid flow from the peripheral outlets of the chamber.

Figure 11A:
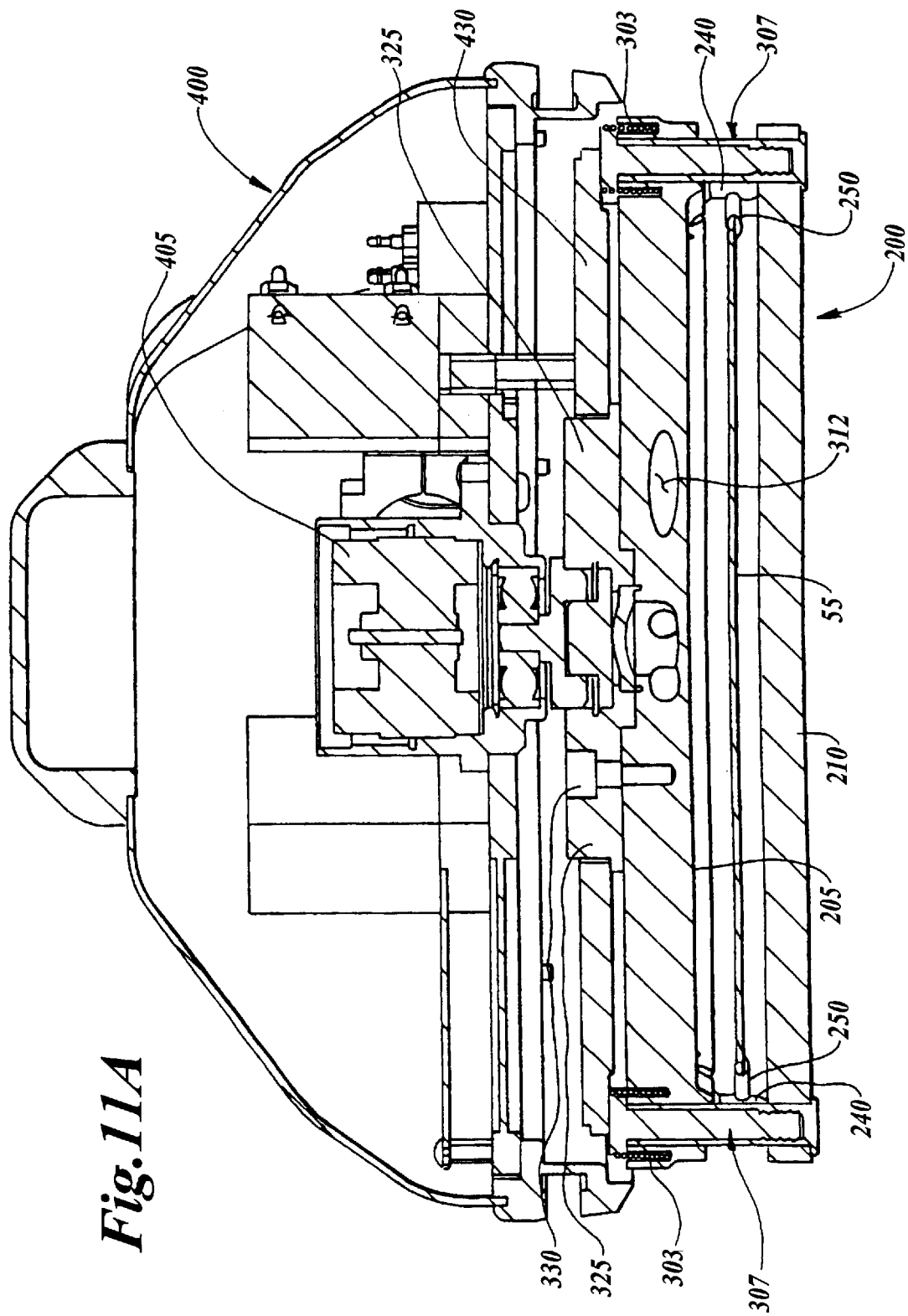

FIGS. 10A and 10B are cross-sectional views showing the reactor 200 in a closed state and connected to a rotary drive assembly, shown generally at 400, while FIGS. 11A and 11B are similar cross-sectional views showing the reactor 200 in an opened state. As shown, shaft 260 extends upward into the rotary drive assembly 400. Shaft 260 is provided with the components necessary to cooperate with a stator 405 to form a rotary drive motor assembly 410.

As in the embodiment of FIG. 4, the upper and lower chamber members 205 and 210 join to define the substantially closed processing chamber 310 that, in the preferred embodiment, substantially conforms to the shape of the workpiece 55. Preferably, the wafer 55 is supported within the chamber 310 in a position in which its upper and lower faces are spaced from the interior chamber faces 215 and 225. As described above, such support is facilitated by the support members 240 and the spacing members 255 that clamp the peripheral edges of the wafer 55 therebetween when the reactor 200 is in the closed position of FIGS. 10A and 10B.

It is in the closed state of FIGS. 10A and 10B that processing of the wafer 55 takes place. With the wafer secured within the processing chamber 310, processing fluid is provided through passageway 415 of shaft 260 and inlet 220 into the interior of chamber 310. Similarly, processing fluid is also provided to the chamber 310 through a processing supply tube 125 that directs fluid flow through inlet 230. As the reactor 200 is rotated by the rotary drive motor assembly 410, any processing fluid supplied through inlets 220 and 230 is driven across the surfaces of the wafer 55 by forces generated through centripetal acceleration. Spent processing fluid exits the processing chamber 310 from the outlets at the peripheral regions of the reactor 200 formed by notches 295 and 296. Such outlets exist since the support members 240 are not constructed to significantly obstruct the resulting fluid flow. Alternatively, or in addition, further outlets may be provided at the peripheral regions.

Once processing has been completed, the reactor 200 is opened to allow access to the wafer, such as shown in FIGS. 11A and 11B. After processing, actuator 425 is used to drive an actuating ring 430 downward into engagement with upper portions of the fasteners 307. Fasteners 307 are driven against the bias of spring 303 causing the lower chamber member 210 to descend and separate from the upper chamber member 205. As the lower chamber member 210 is lowered, the support members 240 follow it under the influence of gravity, or against the influence of a biasing member, while concurrently lowering the wafer. In the lower position, the reactor chamber 310 is opened thereby exposing the wafer for removal and/or allowing a new wafer to be inserted into the reactor 200. Such insertion and extraction can take place either manually, or by an automatic robot.

The foregoing arrangement makes the reactor 200 particularly well-suited for automated workpiece loading and unloading by, for example, a robotic transfer mechanism or the like. As evident from a comparison of FIGS. 10A and 11A, the spacing between the upper surface of the workpiece and the interior chamber wall of the upper chamber member 205 varies depending on whether the reactor 200 is in an open or closed state. When in the open state, the upper surface of the workpiece is spaced from the interior chamber wall of the upper chamber member 205 by a distance, x1, that provides sufficient clearance for operation of, for example, a workpiece transfer arm of a robotic transfer mechanism. When in the closed processing state, the upper surface of the workpiece is spaced from the interior chamber wall of the upper chamber member 205 by a distance, x2, that is less than the distance, x1. The distance, x2, in the disclosed embodiment may be chosen to correspond to the spacing that is desired during workpiece processing operations. While the processing of upper and lower surfaces is disclosed, processing of only a single surface is also within the scope of the present invention.

Figure 12A:
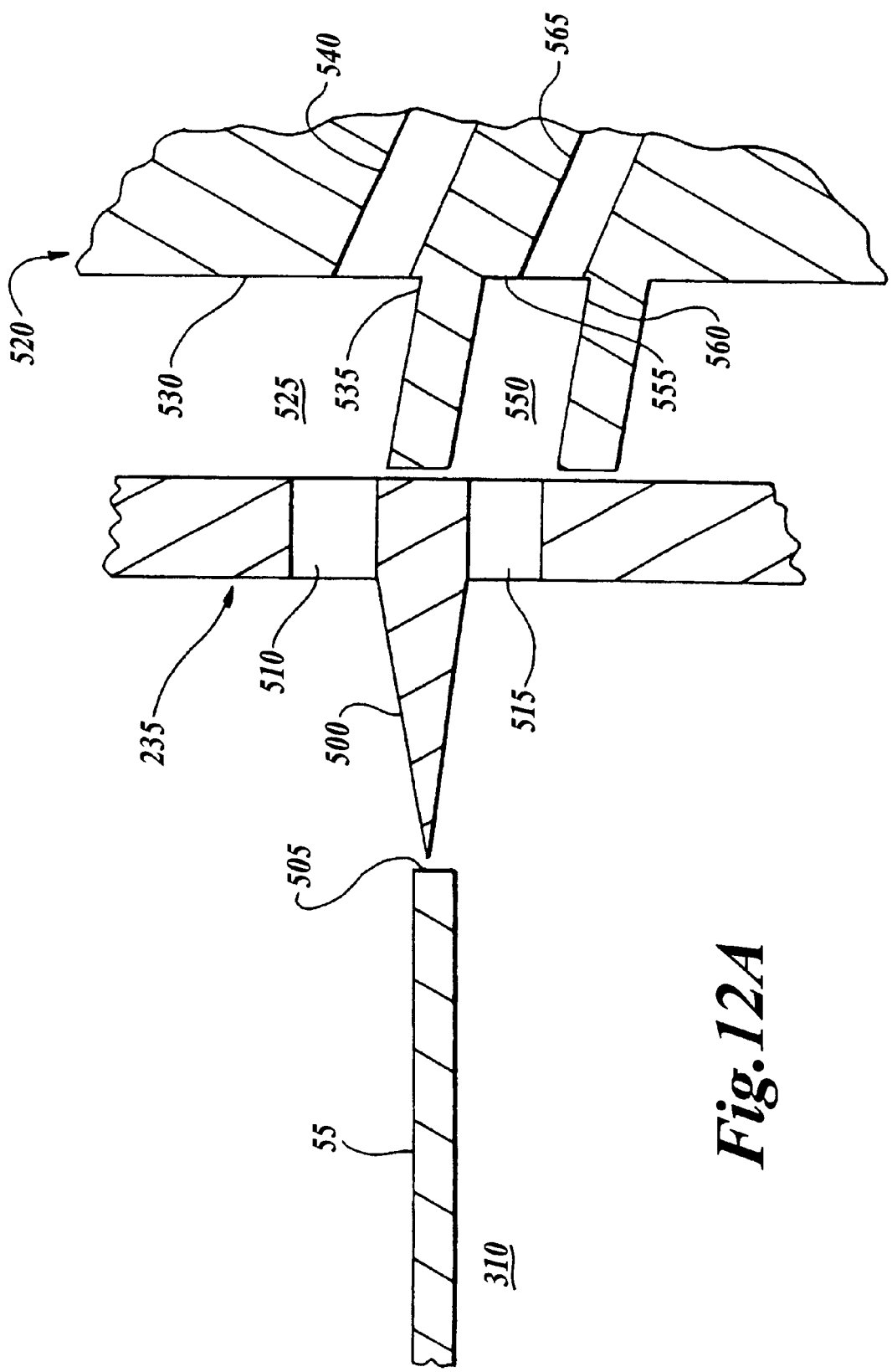
FIGS. 12A, 12B, and 12C illustrate three embodiments of edge configurations that facilitate mutually exclusive processing of the upper and lower wafer surfaces in the workpiece housing.

FIG. 12A illustrates an edge configuration that facilitates separate processing of each side of the wafer. As illustrated, a dividing member 500 extends from the sidewall 235 of the processing chamber 310 to a position immediately proximate the peripheral edge 505 of the wafer 55. The dividing member 500 may take on a variety of shapes, the illustrated tapered shape being merely one configuration. The dividing member 500 preferably extends about the entire circumference of the chamber 310. A first set of one or more outlets 510 is disposed above the dividing member 500 to receive spent processing fluid from the upper surface of the wafer. Similarly, a second set of one or more outlets 515 is disposed below the dividing member 500 to receive spent processing fluid from the lower surface of the wafer. When the wafer rotates during processing, the fluid through supply 415 is provided to the upper surface of the wafer 55 and spreads across the surface through the action of centripetal acceleration. Similarly, the fluid from supply tube 125 is provided to the lower surface of the wafer and spreads across the surface through the action of centripetal acceleration. Because the edge of the dividing member 500 is so close to the peripheral edge of the wafer, processing fluid from the upper surface of the wafer does not proceed below the dividing member 500, and processing fluid from the lower surface of the wafer does not proceed above the dividing member 500. As such, this reactor construction makes it possible to concurrently process both the upper and lower surfaces of the wafer in a mutually exclusive manner using different processing fluids and steps.

FIG. 12A also illustrates one manner in which the processing fluids supplied to the upper and lower wafer surfaces may be collected in a mutually exclusive manner. As shown, a fluid collector 520 is disposed about the exterior periphery of the reactor 200. The fluid collector 520 includes a first collection region 525 having a splatter stop 530 and a fluid trench 535 that is structured to guide fluid flung from the outlets 510 to a first drain 540 where the spent fluid from the upper wafer surface may be directed to a collection reservoir for disposal or re-circulation. The fluid collector 520 further includes a second collection region 550 having a further splatter stop 555 and a further fluid trench 560 that is structured to guide fluid flung from the outlets 515 to a second drain 565 where the spent fluid from the lower wafer surface may be directed to a collection reservoir for disposal or re-circulation.

Figure 12B:
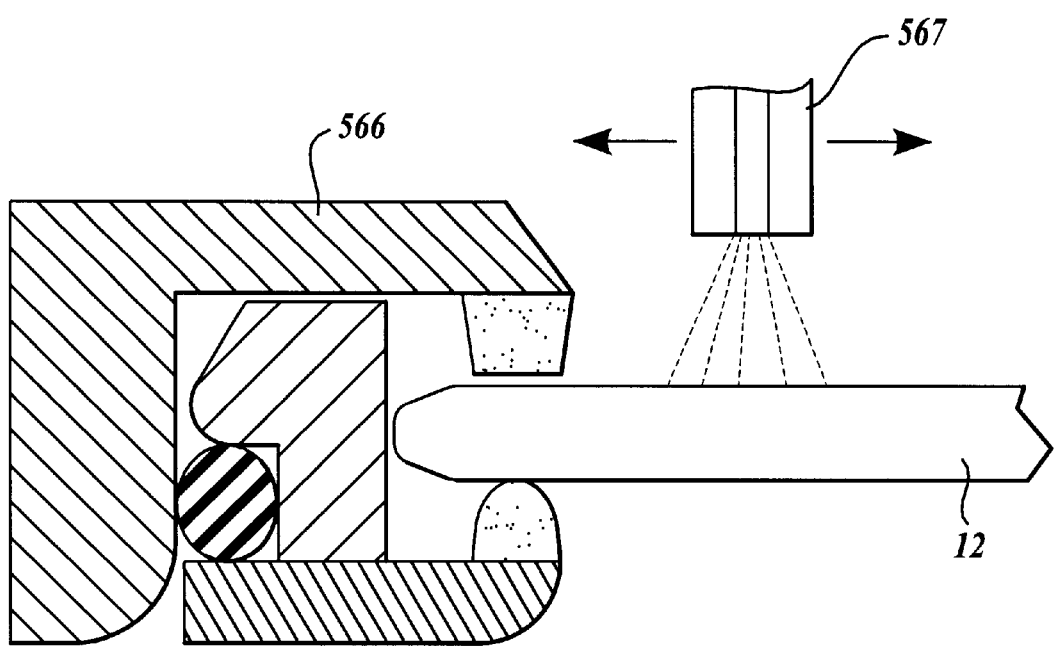
Figure 12C:
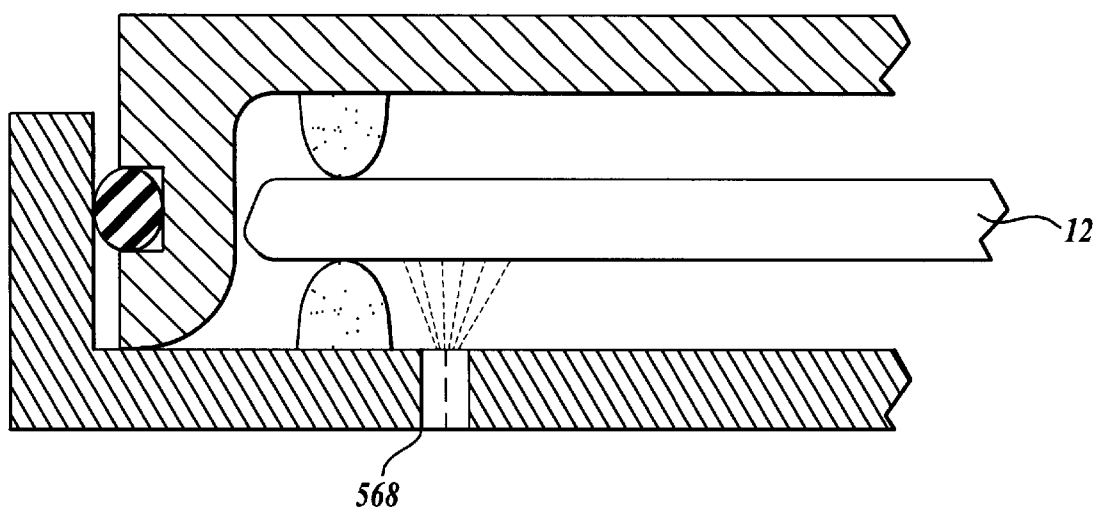

FIGS. 12B and 12C illustrate two alternate embodiments for peripheral edge and front side exclusion zone treatment using reactors and processes of the present invention. Referring to FIG. 12B, the peripheral edge of the wafer 12 is engaged by an edge seal 566, while a nozzle 567 positioned above the front side exclusion zone, radially outboard from the center of the wafer, applies etchant or other solution to the exclusion zone. Alternately, if treatment of the entire front side, or treatment of the back side, is desired, multiple nozzles can be used at different radial locations, or the nozzle can move inwards and outwards while applying the treatment solution. FIG. 12C illustrates a still further embodiment, in which rather than a nozzle 567, an inlet 568 is provided for application of a fluid above the exclusion zone or at other locations through the reaction chamber wall onto the side of the wafer to be treated.

Figure 13:
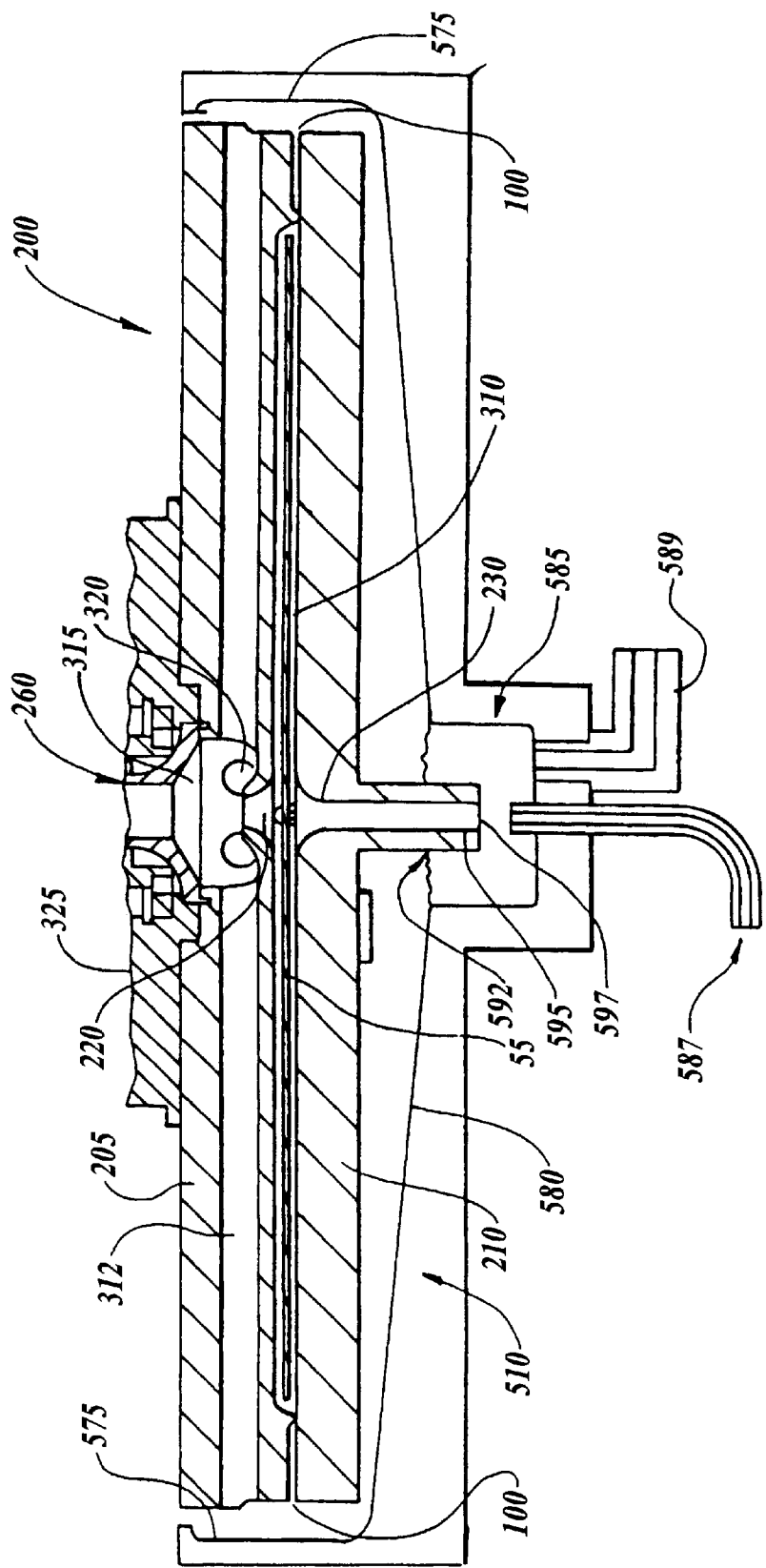
FIG. 13 illustrates an embodiment of the workpiece housing employed in connection with a self-pumping re-circulation system.

FIG. 13 illustrates an embodiment of the reactor 200 having an alternate configuration for supplying processing fluid through the fluid inlet opening 230. As shown, the workpiece housing 20 is disposed in a cup 570. The cup 570 includes sidewalls 575 exterior to the outlets 100 to collect fluid as it exits the chamber 310. An angled bottom surface 580 directs the collected fluid to a sump 585. Fluid supply line 587 is connected to provide an amount of fluid to the sump 585. The sump 585 is also preferably provided with a drain valve 589. An inlet stem 592 defines a channel 595 that includes a first end having an opening 597 that opens to the sump 585 at one end thereof and a second end that opens to the inlet opening 230.

In operation of the embodiment shown in FIG. 13, processing fluid is provided through supply line 587 to the sump 585 while the reactor 200 is spinning. Once the sump 585 is full, the fluid flow to the sump through supply line 587 is eliminated. Centripetal acceleration resulting from the spinning of the reactor 200 provides a pressure differential that drives the fluid through openings 597 and 230, into chamber 310 to contact at least the lower surface of the wafer, and exit outlets 100 where the fluid is re-circulated to the sump 585 for further use.

There are numerous advantages to the self-pumping re-circulation system illustrated in FIG. 13. The tight fluid loop minimizes lags in process parameter control thereby making it easier to control such physical parameters as fluid temperature, fluid flow, etc. Further, there is no heat loss to plumbing, tank walls, pumps, etc. Still further, the system does not use a separate pump, thereby eliminating pump failures which are common when pumping hot, aggressive chemistries.

Figure 14:
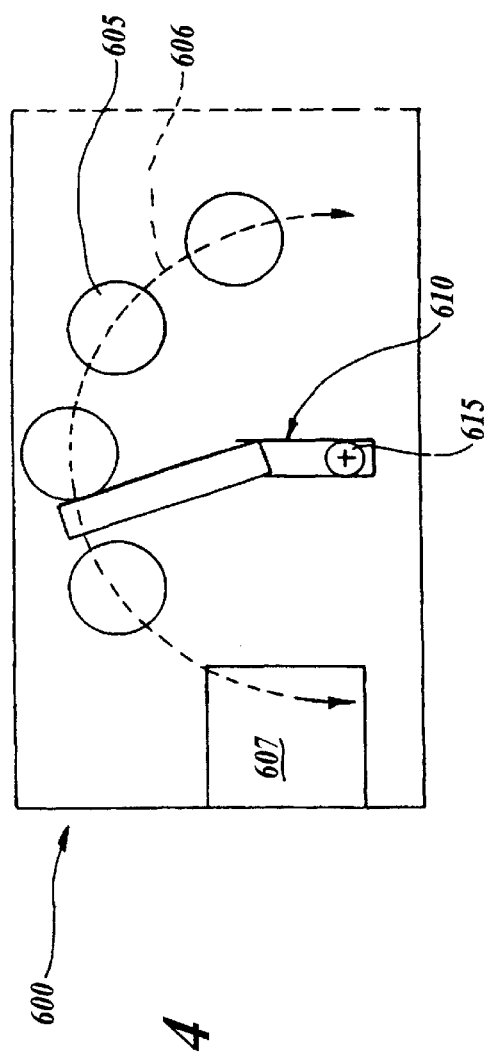
FIGS. 14 and 15 are schematic diagrams of exemplary processing tools that employ the present invention.
Figure 15:
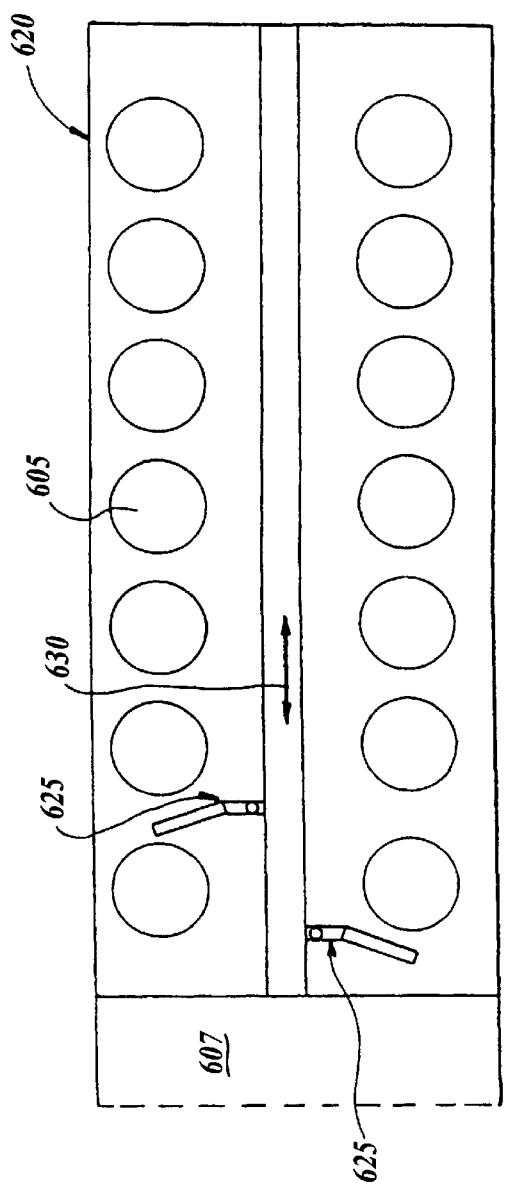

FIGS. 14 and 15 illustrate two different types of processing tools, each of which may employ one or more processing stations including the reactor constructions described above. FIG. 14 is a schematic block diagram of a tool, shown generally at 600, including a plurality of processing stations 605 disposed about an arcuate path 606. The processing stations 605 may all perform similar processing operations on the wafer, or may perform different but complementary processing operations. For example, one or more of the processing stations 605 may execute an electrodeposition process of a metal, such as copper, on the wafer, while one or more of the other processing stations perform complementary processes such as, for example, clean/dry processing, pre-wetting processes, photoresist processes, etc.

Wafers that are to be processed are supplied to the tool 600 at an input/output station 607. The wafers may be supplied to the tool 600 in, for example, S.M.I.F. pods, each having a plurality of the wafers disposed therein. Alternatively, the wafers may be presented to the tool 600 in individual workpiece housings, such as at 20 of FIG. 4.

Each of the processing stations 605 may be accessed by a robotic arm 610. The robotic arm 610 transports the workpiece housings, or individual wafers, to and from the input/output station 607. The robotic arm 610 also transports the wafers or housings between the various processing stations 605.

In the embodiment of FIG. 14, the robotic arm 610 rotates about axis 615 to perform the transport operations along path 606. In contrast, the tool shown generally at 620 of the FIG. 15 utilizes one or more robotic arms 625 that travel along a linear path 630 to perform the required transport operations. As in the embodiment of FIG. 13, a plurality of individual processing stations 605 are used, but more processing stations 605 may be provided in a single processing tool in this arrangement.

FIG. 16 illustrates one manner of employing a plurality of workpiece housings 700, such as those described above, in a batch processing apparatus 702. As shown, the workpiece housings 700 are stacked vertically with respect to one another and are attached for rotation by a common rotor motor 704 about a common rotation axis 706. The apparatus 702 further includes a process fluid delivery system 708. The delivery system 708 includes a stationary manifold 710 that accepts processing fluid from a fluid supply (not shown). The stationary manifold 710 has an outlet end connected to the input of a rotating manifold 712. The rotating manifold 712 is secured for co--rotation with the housings 700 and, therefore, is connected to the stationary manifold 710 at a rotating joint 714. A plurality of fluid supply lines 716 extend from the rotating manifold 712 and terminate at respective nozzle portions 718 proximate inlets of the housings 700. Nozzle portions 718 that are disposed between two housings 700 are constructed to provide fluid streams that are directed in both the upward and downward directions. In contrast, the lowermost supply line 716 includes a nozzle portion 718 that directs a fluid stream only in the upward direction. The uppermost portion of the rotating manifold 712 includes an outlet 720 that provides processing fluid to the fluid inlet of the uppermost housing 700.

The batch processing apparatus 702 of FIG. 16 is constructed to concurrently supply the same fluid to both the upper and lower inlets of each housing 700. However, other configurations may also be employed. For example, nozzle portions 718 may include valve members that selectively open and close depending on whether the fluid is to be supplied through the upper and/or lower inlets of each housing 700. In such instances, it may be desirable to employ an edge configuration, such as the one shown in FIG. 12, in each of the housings 700 to provide isolation of the fluids supplied to the upper and lower surfaces of the wafers 55. Still further, the apparatus 702 may include concentric manifolds for supplying two different fluids concurrently to individual supply lines respectively associated with the upper and lower inlets of the housings 700.

An embodiment of the reactor that is particularly well-suited for integration in an automated processing tool is illustrated in FIG. 17. The reactor, shown generally at 800, includes features that cooperate in a unique manner to allow a robotic arm or the like to insert and extract a workpiece to and from the reactor 800 during loading and unloading operations while also maintaining relatively tight clearances between the workpiece and the interior chamber walls of the reactor during processing.

One of the principal differences between the reactor embodiments described above and the reactor 800 of FIG. 17 lies in the nature of the workpiece support assembly. As shown, reactor 800 includes a workpiece support assembly, shown generally at 805, that is associated with the lower chamber member 210. In accordance with the illustrated embodiment, the workpiece support assembly 805 includes a plurality of workpiece support members 810 that extend through the lower chamber member 210. The workpiece support members 810 are supported at a lower end thereof by a biasing member 815. At the end of the workpiece support member 810 that is distal the biasing member 815, the workpiece support member 810 terminates at a workpiece support surface 820 and a guide structure 825. The guide structure 825 extends from the workpiece support surface 820 and terminates at a frustoconical section 830. The guide structure 825 assists in urging the peripheral edges of the workpiece into proper alignment with the workpiece support surface 820 thereby ensuring proper registration of the workpiece during processing. The guide structure 825 may also serve as a spacer that defines the clearance between the interior chamber wall of the upper chamber member 205 and the upper surface of the workpiece.

The biasing member 815 of the illustrated embodiment serves to bias the workpiece support members 810 in an upward direction when the upper and lower chamber members 205 and 210 are in the illustrated open condition in which the reactor 800 is ready for loading or unloading the workpiece. The biasing member 815 may take on various forms. For example, a single biasing structure may be used that is common to all of the workpiece support members 810. Alternatively, as shown in the disclosed embodiment, individual biasing structures may be respectively associated with individual ones of the workpiece support members 810. The individual biasing structures are in the form of leaf springs 835 but, for example, may alternatively be in the form of coil spring actuators or the like.

As in the embodiment of the reactor described above, the upper and lower chamber members 205 and 210 of reactor 800 are movable with respect to one another between the open condition of FIG. 17 to a closed processing condition as illustrated in FIG. 18. As the chamber members 205 and 210 move toward one another, the frustoconical sections 830 of the workpiece support members 810 engage the interior chamber wall of the upper chamber member 205. Continued movement between the chamber members 205 and 210 drives the workpiece support members 810 against the leaf springs 835 until the workpiece is clamped between the support surfaces 820 of the workpiece support members 810 and corresponding projections 840 that extend from the interior chamber wall of the upper chamber member 205. While in this closed state, the reactor is ready to process the workpiece.

The reactor 800 of FIG. 17 also includes structures which assists in ensuring proper registration between the upper and a lower chamber members 210 and 205 as they are brought proximate one another to their processing position. In the illustrated embodiment, these structures are in the form of lead-in pins 845 that extend from one of the chamber members to engage corresponding apertures of the other of the chamber members. Here, the lead-in pins 845 extend from the lower chamber member 210 to engage corresponding apertures (not shown) in the upper chamber member 205. The lead-in pins 845 are in the form of upstanding members that each terminate in a respective frustoconical section that functions as a guide surface.

The foregoing arrangement makes the reactor 800 particularly well-suited for automated workpiece loading and unloading by, for example, a robotic transfer mechanism or the like, particularly one in which the workpiece is directly inserted into the reactor without flipping of the workpiece. As evident from a comparison of FIGS. 17 and 18, the spacing between the lower surface of the workpiece and the interior chamber wall of the lower chamber member 210 varies depending on whether the reactor 800 is in an open or closed state. When in the open state, the lower surface of the workpiece is spaced from the interior chamber wall of the lower chamber member 210 by a distance, x1, that provides sufficient clearance for operation of, for example, a workpiece transfer arm of a robotic transfer mechanism. When in the closed processing state, the lower surface of the workpiece is spaced from the interior chamber wall of the lower chamber member 210 by a distance, x2, that is less than the distance, x1. The distance, x2, in the disclosed embodiment corresponds to the spacing that is desired during workpiece processing operations.

One embodiment of the biasing member 815 is illustrated in FIG. 19. As shown, the biasing member 815 is comprised of a plurality of leaf springs 835 that extend radially from a central hub portion 850 to positions in which they contact the underside of respective workpiece support members 810. A further plurality of radial members 855 extend from the hub 850 to positions in which they contact the underside of respective lead-in pins 845. Unlike the leaf springs 835, the further plurality of radial members 855 are not necessarily designed to flex as the upper and lower chamber members 210 and 205 move toward the processing position. The biasing member 825 may be formed from a polymer material or the like which is resistant to the chemistry used in the processing environment. When formed from such a material, the workpiece support members 810 and lead-in pins 845 may be formed integral with their respective leaf springs 835 and radial members 855.

In the illustrated embodiment, the central hub portion 850 includes a central aperture 900 that accommodates a securement 905 which connects the biasing member 815 to the underside of the lower chamber member 210. With reference to FIGS. 17 and 18, the securement 905 can be formed to provide the processing fluid inlet through the lower chamber member 210. When the securement 905 is formed in this manner, the reactor 800 is provided with a quick and easy manner of providing different inlet configurations for different processes.

On occasion, it may be desirable to remove the reactor 800 from head portion 860. For example, the reactor 800 may be removed for service or for replacement with a reactor that is designed for executing other processes, or processing other workpiece types.

To this end, the reactor 800 and the head portion 860 are engaged at a connection hub assembly 865 which allows the reactor 800 to be easily connected to and disconnected from the head portion 860. In embodiment illustrated in FIG. 18, the connection hub assembly 865 is comprised of a head heating connection hub 870 that is fixed to the processing head portion 860, and a reactor connection hub 875 that is fixed to the reactor 800. The connection hubs 870 and 875 are secured to one another during normal operation by, for example, a threaded joint 880. A set screw 885 extends through the head connection hub 870 and may be rotated to engage a surface of or corresponding aperture in the reactor connection hub 875 to thereby prevents the connection hubs 870 and 875 from unscrewing.

When removal of the reactor 800 is desired, the reactor is rotated to align set screw 885 with a corresponding channel sleeve 890 that is fixed to the head portion 860. The channel sleeve 890 is constructed to allow a user to extend a tool therethrough to engage the set screw 885. The set screw is then turned to raise it until it engages and secures with a screw head block 895. Once secured in this manner, the head connection hub 870 is rotationally locked with the head portion 860 thereby allowing the reactor 800 and corresponding reactor connection hub 875 to be unscrewed from the head connection hub 870 to remove the reactor.

In accordance with a still further feature of the reactor 800, a stiffening member 910 formed, for example, from aluminum is secured with the upper chamber member 205. By increasing the stiffness of the upper and/or lower chamber members, higher rotating speeds may be used and, further, the flatness of the interior chamber walls during processing may be increased.

Numerous substantial benefits flow from the use of the disclosed reactor configurations. Many of these benefits arise directly from the reduced fluid flow areas in the reactor chambers. Generally, there is a more efficient use of the processing fluids since very little of the fluids are wasted. Further, it is often easier to control the physical parameters of the fluid flow, such as temperature, mass flow, etc., using the reduced fluid flow areas of the reactor chambers. This gives rise to more consistent results and makes those results repeatable.

The foregoing constructions also give rise to the ability to perform sequential processing of a single wafer using two or more processing fluids sequentially provided through a single inlet of the reaction chamber. Still further, the ability to concurrently or sequentially provide different fluids to the upper and lower surfaces of the wafer opens the opportunity to implement novel processing operations. For example, a processing fluid, such as HF liquid, may be supplied to a lower fluid inlet of the reaction chamber for processing the lower wafer surface while an inert fluid, such as nitrogen gas, may be provided to the upper fluid inlet. As such, the HF liquid is allowed to react with the lower surface of the wafer while the upper surface of the wafer is effectively isolated from HF reactions. Numerous other novel processes may also be implemented.

The present inventors have recognized that demands for integrated circuit rinsing/drying processes may ultimately require more control and economic efficiency from the rinser/dryer. As such, a substantially new approach to rinsing and drying of the semiconductor wafer has been undertaken which provides greater control of the physical properties of the rinsing and drying fluids. Further, wafers may be rinsed and dried on an individual basis more quickly when compared to the drying of an individual wafer using any of the foregoing processes.

Figure 20:
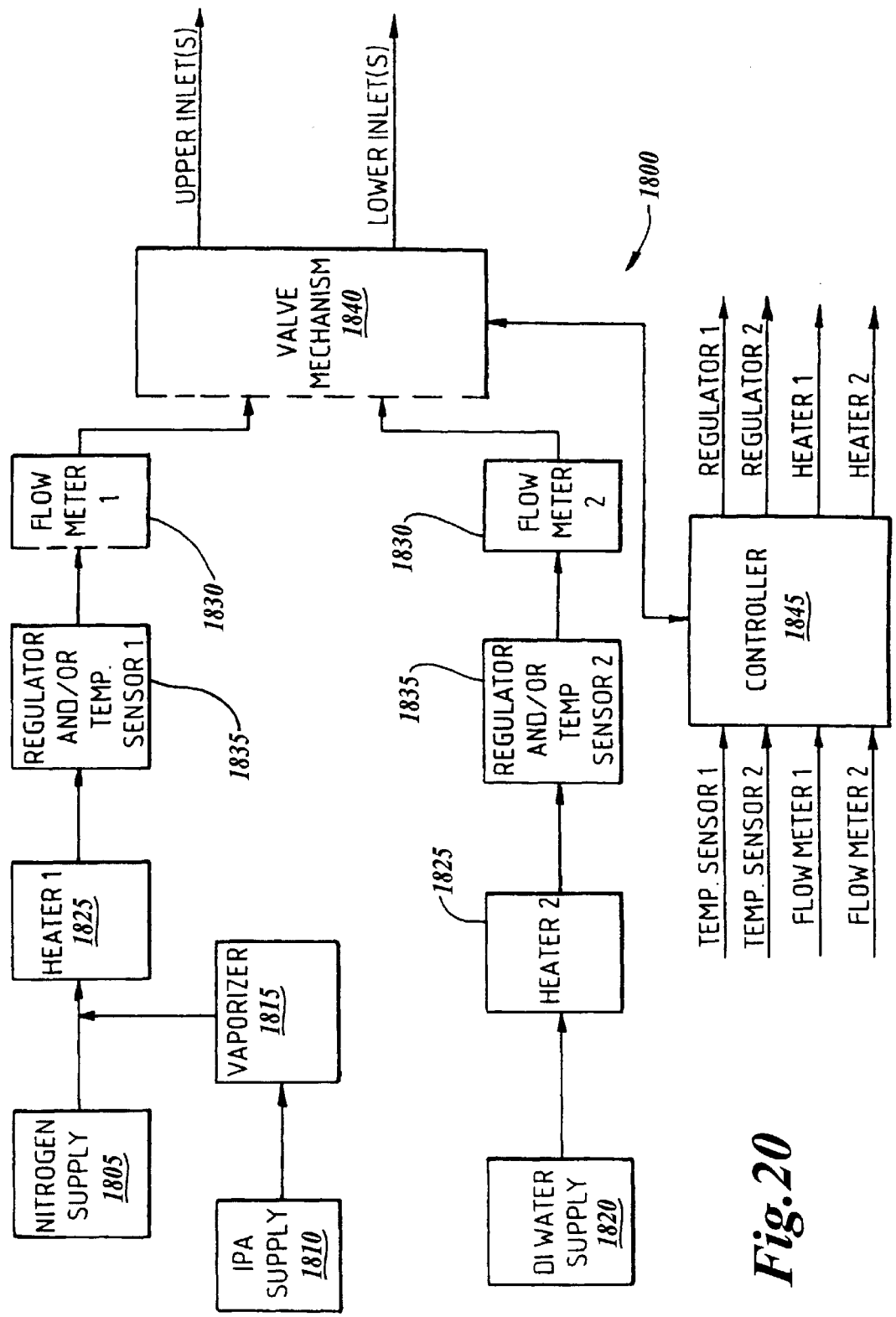
FIG. 20 illustrates a system in which the foregoing reactor is used to implement a rinsing/drying process.
Figure 21:
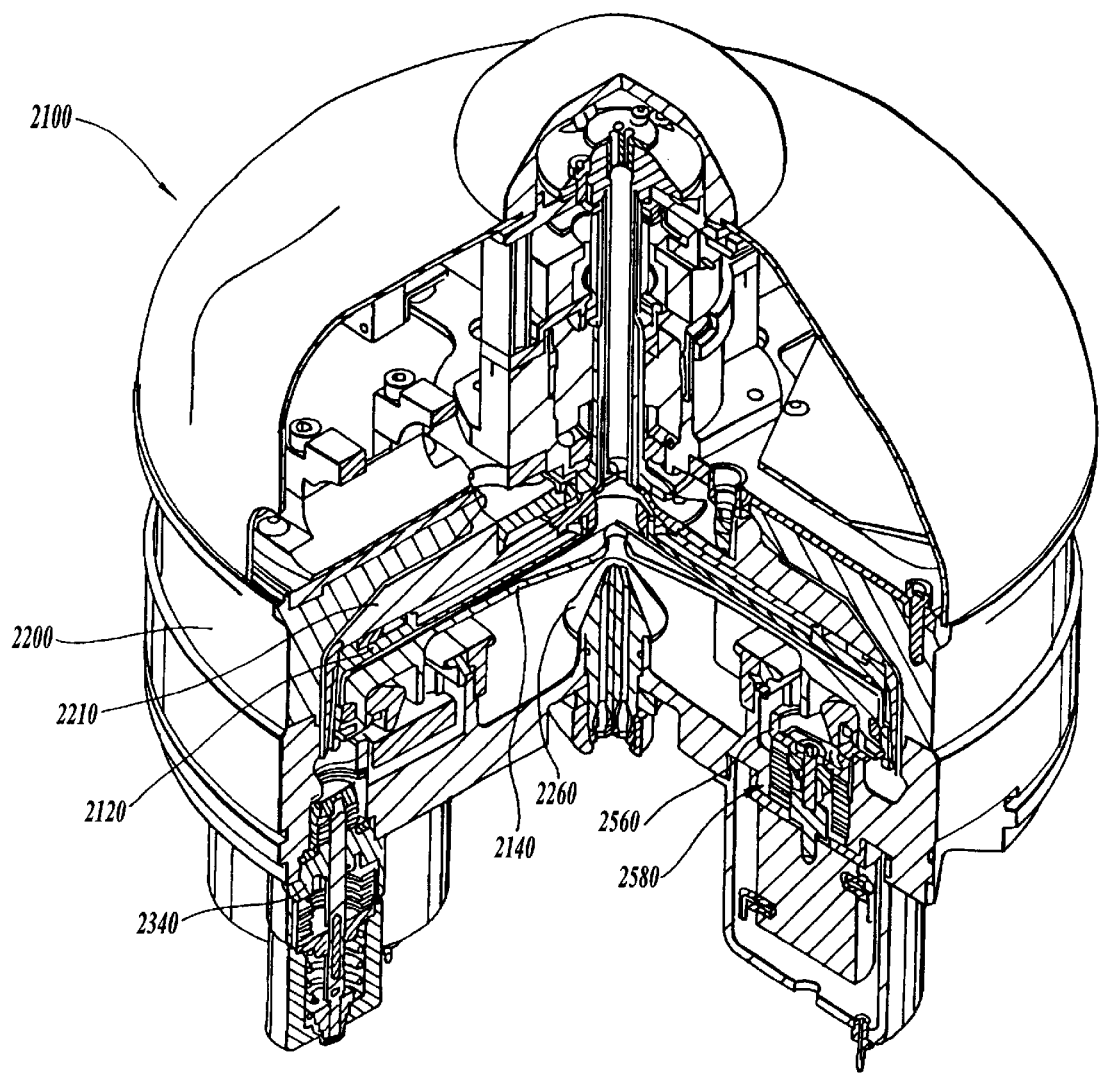
FIG. 21 is a cut-away, perspective view of the reactor, as seen from a different vantage.
Figure 22:
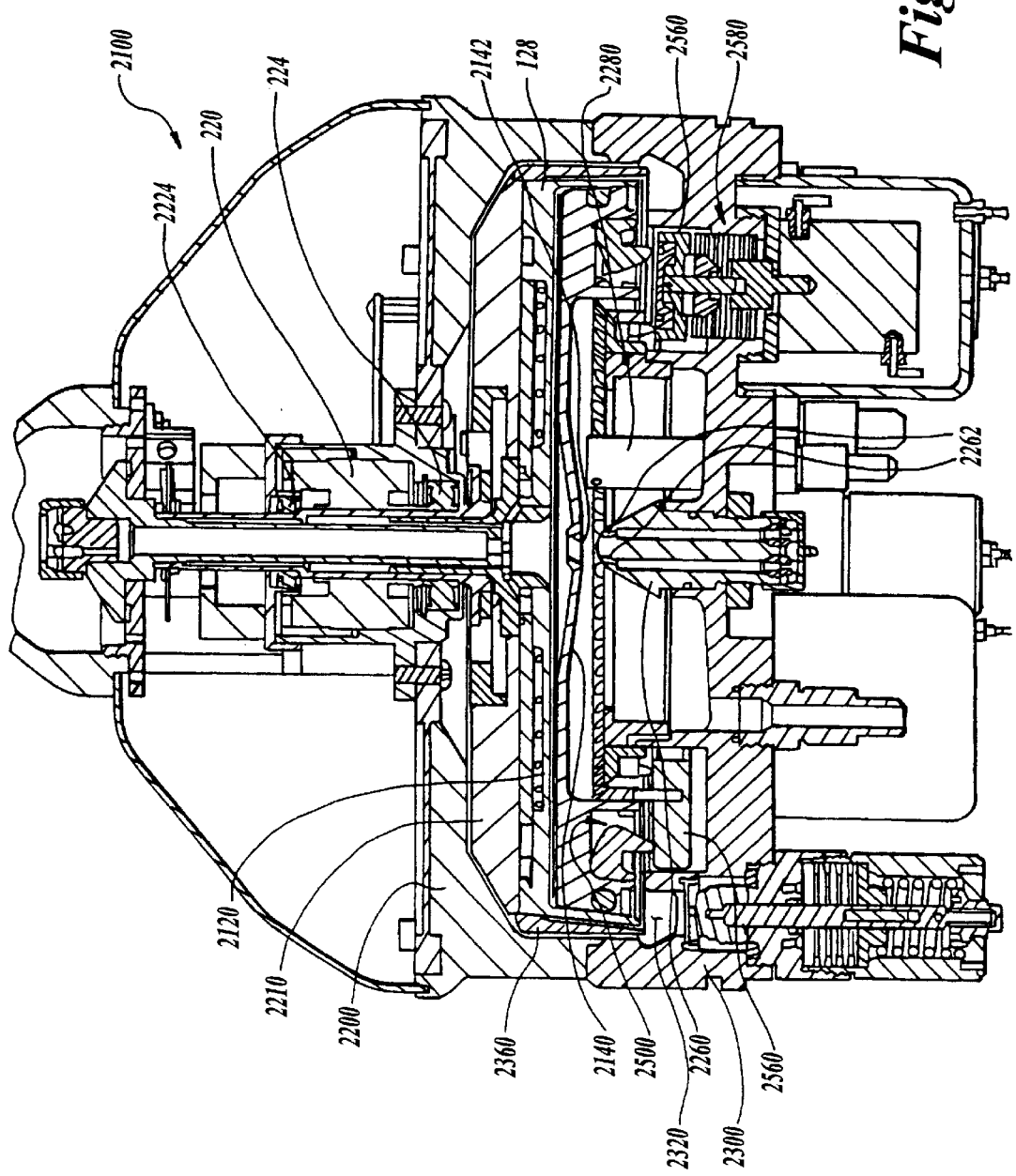
FIG. 22 is a cross-sectional view of the reactor, as taken through its central, vertical axis.
Figure 23:
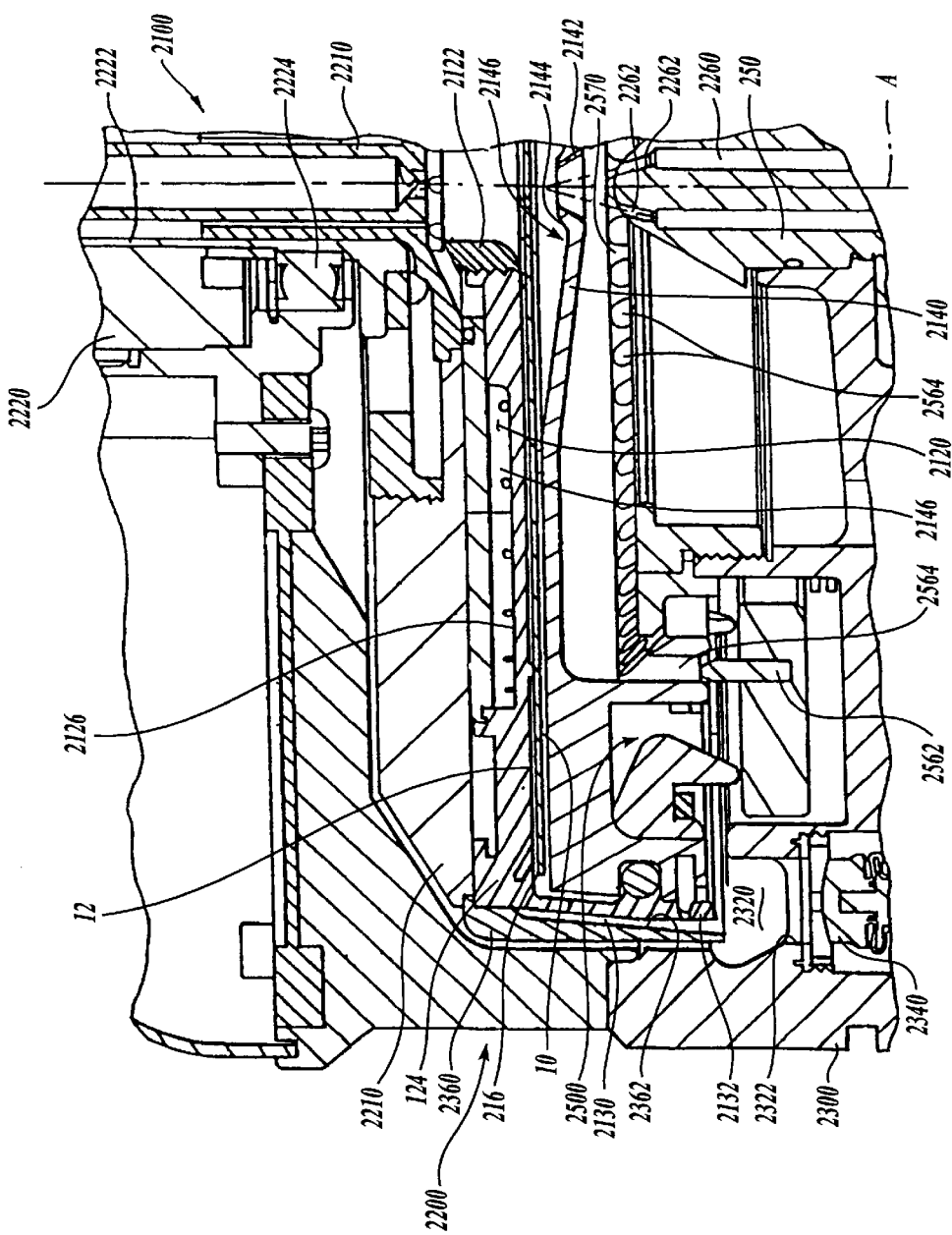
FIG. 23 is an enlarged detail of certain elements of the reactor, as taken within a circle drawn in FIG. 3.
Figure 25:
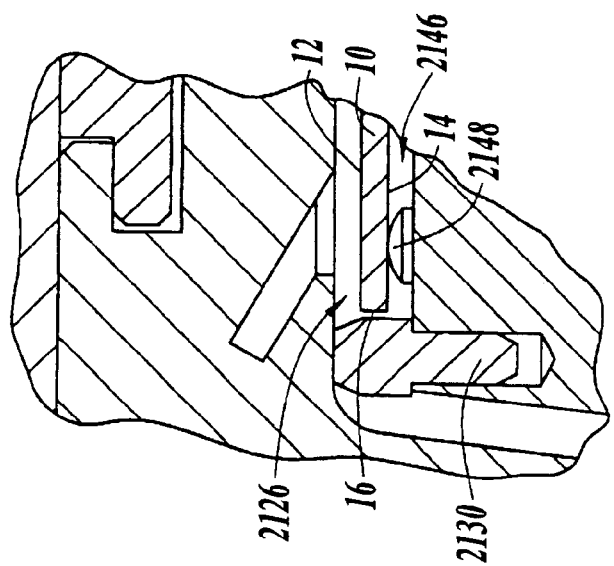
FIGS. 24 and 25 are further enlarged details of a portion of what is illustrated in FIG. 23, as taken at different places around the reactor.
Figure 24:
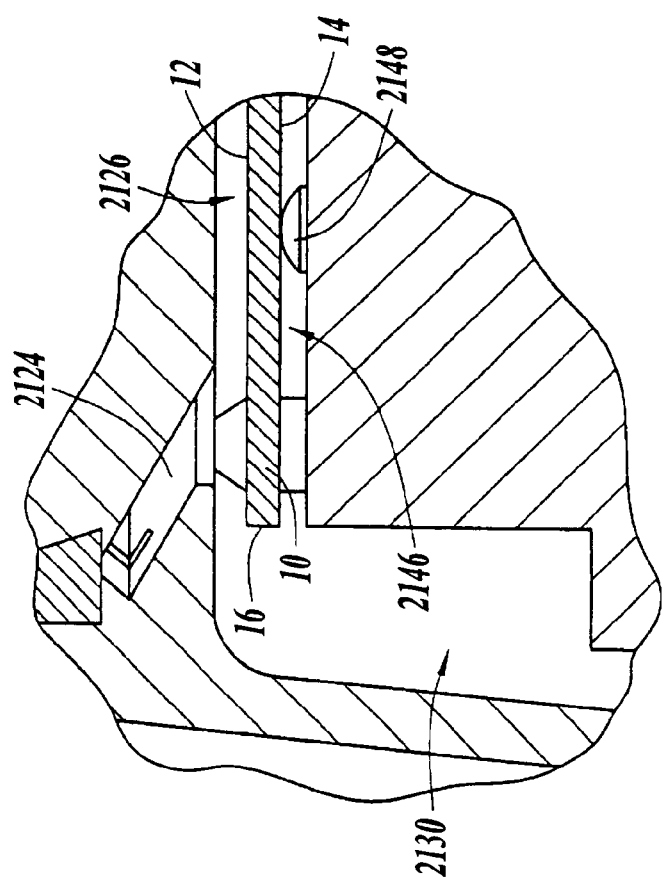
Figure 26:
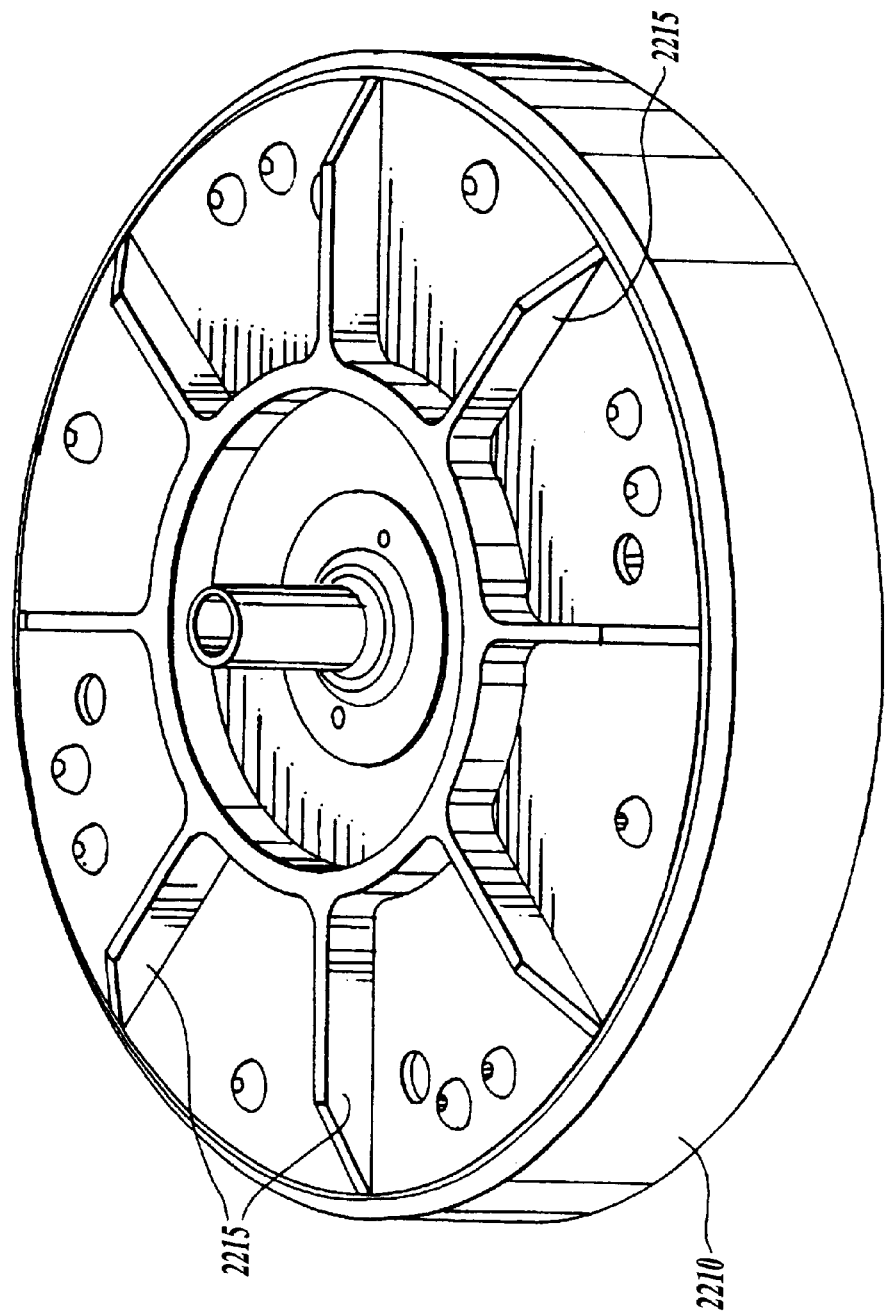
FIG. 26 is an enlarged, perspective view of a rotor, as used in the reactor.
Figure 27:
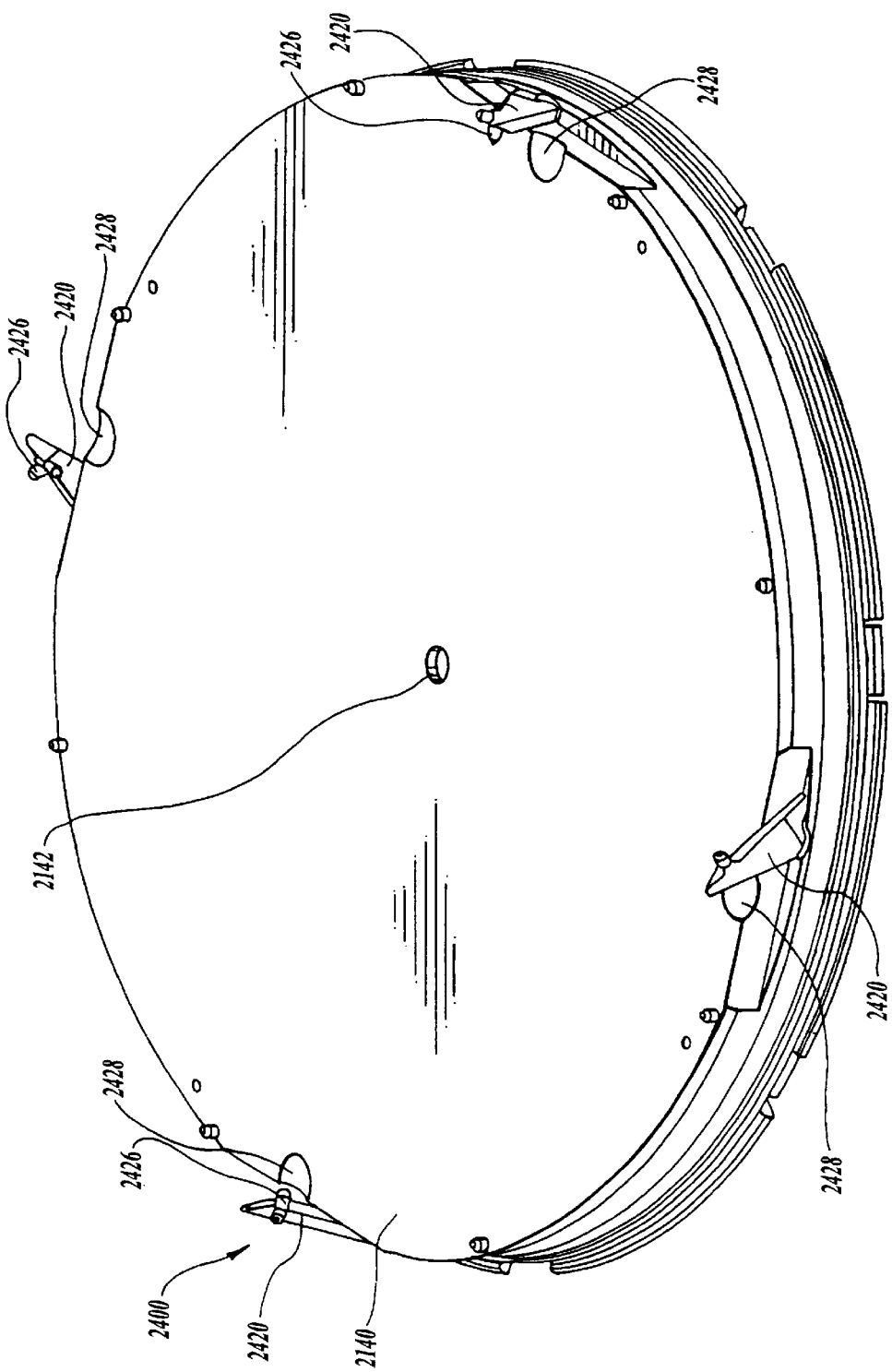
FIG. 27 is an enlarged, perspective view of a lower chamber wall and four lifting levers, as used in the reactor.

FIG. 20 illustrates one manner of controlling the provision of rinsing/drying fluids that are supplied to the rinser/dryer of any of the foregoing embodiments. As illustrated, the fluid supply system, shown generally at 1800, includes a nitrogen gas supply 1805, an IPA supply 1810, an IPA vaporizer 1815, a DI water supply 1820, optional, heating elements 1825, optional flowmeters 1830, optional flow regulators/temperature sensors 1835, and valve mechanism 1840. All of the various components of the system 1800 may be under the control of a controller unit 845 having the appropriate software programming.

In operation of the rinser/dryer, the valve mechanism 1840 is connected to supply DI water from supply 1820 to both the upper and lower inlets of the rinser/dryer chamber. As the water is supplied to the chamber, the wafer is spun at, for example, a rate of 200 RPM. This causes the water to flow across each surface of the wafer under the action of centripetal acceleration. Once a sufficient amount of water has been supplied to the chamber to rinse the wafer surfaces, valve mechanism 1840 is operated to provide a drying fluid, preferably comprised of nitrogen and IPA vapor, to both the upper and lower inlets of the rinser/dryer chamber. Valve mechanism 1840 is preferably operated so that the front of the drying fluid immediately follows the trailing end of the DI water. As the drying fluid enters the chamber, centripetal acceleration resulting from the spinning of the wafer drives the drying fluid across the wafer surface and follows a meniscus across the wafer surface formed by the DI water. The IPA vapor assists in providing a drying of the surface of the wafer at the edge of the meniscus. Drying of the wafer may be further enhanced by heating the DI water and/or the nitrogen/IPA vapor using heating elements 1825. The particular temperature at which these fluids are supplied may be controlled by the controller 1845. Similarly, flow regulators 1835 and flowmeters 1830 may be used by controller 1845 to regulate the flow of the DI water and/or the nitrogen/IPA vapor to the rinser/dryer chamber.

With some modifications, the foregoing reactor designs may be adapted to execute several unique processes in which contact between the microelectronic workpiece and one or more processing fluids is controlled and confined to selected areas of the workpiece. One embodiment of such a reactor design is shown in FIGS. 21–25.

With reference to FIGS. 21–25, there is shown a reactor 2100 for processing a microelectronic workpiece, such as a silicon wafer 10 having an upper side 12, a lower side 14, and an outer, circular perimeter 16, in a micro-environment. For certain applications, the upper side 12 is the front side, which may be otherwise called the device side, and the lower side 14 is the back side, which may be otherwise called the non-device side. However, for other applications, the silicon wafer 10 is inverted.

Generally, except as disclosed herein, the reactor 2100 is similar to the reactors illustrated and described above. However, as illustrated in the drawings and described herein, the reactor 2100 is improved to be more versatile in executing selected microelectronic fabrication processes.

The reactor 2100 has an upper chamber member that includes an upper chamber wall 2120 and a lower chamber member that includes a lower chamber wall 2140. These walls 2120, 2140, are arranged to open so as to permit a wafer 10 to be loaded into the reactor 100 for processing, by a loading and unloading mechanism (not shown) that, for example, may be in the form of a robot having an end effector. These walls 2120, 2140, are arranged to close so as to define a capsule 2160 supporting a wafer 10 in a processing position, between these walls 2120, 2140.

The reactor 2100, which defines a rotation axis A, has a head 2200 containing a rotor 2210, which mounts the upper chamber wall 2120, and mounting a motor 2220 for rotating the rotor 2210 and the upper and lower chamber walls 2120, 2140, when closed, around the axis A, conjointly with a wafer 10 supported in the processing position. The motor 2220 is arranged to drive a sleeve 2222, which is supported radially in the head 2200, by rolling-element bearings 2224. The head 2200 is arranged to be raised for opening these walls 2120, 2140, and to be lowered for closing these walls 2120, 2140.

The upper chamber wall 2120 has an inlet 2122 for processing fluids, which may be liquid, vaporous, or gaseous, and the lower chamber wall 2140 has an inlet 2142 for such fluids, which for a given application may be similar fluids or different fluids. The head 2200 mounts an upper nozzle 2210, which extends axially through the sleeve 2222 so as not to interfere with the rotation of the sleeve 2222. The upper nozzle 2210 directs streams of processing fluids downwardly through the inlet 2122 of the upper chamber wall 2120.

The upper chamber wall 2120 includes an array of similar outlets 2124, which are spaced similarly at uniform angular spacings around the vertical axis A. In the disclosed embodiment, thirty-six such outlets 2124 are employed. Each outlet 2124 is spaced outwardly from the vertical axis A by a comparatively larger radial distance and is spaced inwardly from the outer perimeter 16 of a wafer 10 supported in the processing position by a comparatively smaller radial distance, such as a distance of approximately 1.5 millimeters or other desired edge exclusion zone.

When the upper and lower chamber walls 2120, 2140, are closed, they define a micro-environment reactor 2160 the having an upper processing chamber 2126 that is defined by the upper chamber wall 2120 and by a first generally planar surface of the supported wafer 10, and a lower processing chamber 2146 that is defined by the lower chamber wall 2140 and a second generally planar surface of the supported wafer opposite the first side. The upper and lower processing chambers 2126, 2146, are in fluid communication with each other in an annular region 2130 beyond the outer perimeter 16 of the supported wafer 10 and are sealed by an annular, compressible seal (e.g. O-ring) 2132 bounding a lower portion 2134 of the annular region 2130. The seal 2132 allows processing fluids entering the lower inlet 2142 to remain under sufficient pressure to flow toward the outlets 2134.

As compared to reactors of the type disclosed in the previously described embodiments, the reactor 2100 is particularly suitable for executing a range of unique microfabrication processes. For example, reactor 2100 is particularly suited to execute a process that requires complete contact of a processing fluid at a first side of a workpiece and at only a peripheral margin portion of the second side thereof. Such processes may be realized because processing fluids entering the inlet 2142 of the lower chamber wall 2140 can act on the lower side 14 of a supported wafer 10, on the outer periphery 16 of the supported wafer 10, and on an outer margin 18 of the upper side 12 of the supported wafer 10 before reaching the outlets 2124, and because processing fluids entering the inlet 2122 of the upper chamber wall 2120 can act on the upper side 12 of the supported wafer 10, except for the outer margin 18 of the upper side 12, before reaching the outlets 2124.

As a significant example of one such process, the reactor 2100 can be used with control of the respective pressures of processing fluids entering the respective inlets 2122, 2142, to carry out a process in which a processing fluid is allowed to contact a first side of the workpiece, the peripheral edge of the workpiece, and a peripheral region of the opposite side of the workpiece. Such fluid flow/contact can also be viewed as a manner of excluding a processing fluid that is applied to the opposite side from a peripheral region of that side. In accordance with one embodiment of such a process, a thin film of material is etched from the first side, peripheral edge of the workpiece, and peripheral region of the opposite side of the workpiece.

In a more specific embodiment of such a process, the process may employed in a metallization process that is used to form a microelectronic component and/or interconnect structures on a semiconductor wafer or the like. To this end, a thin film, such as the seed layer, is applied over a barrier layer on the front side and over at least a portion of the outer perimeter. After one or more intervening steps, such as electroplating of a copper layer or the like thereover, an etchant capable of etching the electroplating material, thin film material, and/or the barrier layer material is caused to flow selectively over only an outer margin of the first side while being concurrently prevented from flowing over other radial interior portions of the first side. Thus, one or more of the layers are removed from the outer margin of the first side while the layers remain intact at the portions of the first side that are disposed interior of the outer margin. If the etchant is driven over the opposite side and over the outer perimeter, as well as over the outer margin of the first side, the one or more layers are also removed from the outer perimeter of the wafer and, further, any contaminant that the etchant is capable of removing is stripped from the back side.

Based on the description of the foregoing process, it will be recognized that other layers and/or materials may be selectively etched, cleaned, deposited, protected, etc., based on selective contact of a processing fluid with the outer margin and/or opposing side of the workpiece. For example, oxide may be removed from the opposite side and outer margin of the first side of a workpiece through selective contact with an oxide etchant, such as hydrofluoric acid. Similarly, the oxide etchant may be controlled in the reactor so that it contacts all of the front side of the workpiece except for the outer margin thereby leaving the oxide at the outer margin intact. It will also be recognized that removal of the outlets 2124 allows the reactor 2100 to be used for processes in which selective outer margin inclusion or exclusion is unnecessary or otherwise undesirable.

As illustrated in FIGS. 26–29, additional structures may be incorporated with any of the foregoing reactors dependent on the particular process(es) the reactor is designed to implement and the automation, if any, that will be used along with it. In accordance with one such structural addition, the lower chamber wall 140 has an upper surface 2144 shaped so as to define an annular sump 2146 around the inlet 2142. The sump 2146 is used to collect liquid byproducts and/or residual processing fluids supplied through the inlet 2142. If a liquid, for example, strikes and drops from wafer 10, it is conducted toward the outlet 2124 under the influence of centripetal acceleration as the reactor 100 is rotated.

Another structural addition illustrated in connection with the reactor 2100 relates to the lower nozzle design. As illustrated, the lower nozzle 2260, which is provided beneath the inlet 2142 of the lower chamber wall 2140, includes two or more ports 2262 (two shown) for directing two or more streams of processing fluids upwardly through the inlet 2142. The ports 2262 are oriented so as to cause the directed streams to converge approximately where the directed streams reach the lower surface of the wafer 10. The reactor 2100 also includes a purging nozzle 2280, which is disposed at a side of the lower nozzle 2260, for directing a stream of purging gas, such as nitrogen, across the lower nozzle 2260.

Still further, the reactor 2100 may have a base 2300, which mounts the lower nozzle 2260 and the purging nozzle 2280 and which defines a coaxial, annular plenum 2320. The plenum 2320 has plural (e.g. four) drains 2322 (one shown) each of which is equipped with a pneumatically actuated, poppet valve 2340 for opening and closing the drain 2322. These drains 2322 provide separate paths for conducting processing liquids of different types to appropriate systems (not shown) for storage, disposal, or recirculation.

An annular skirt 2360 extends around and downwardly from the upper chamber wall 2120, above the plenum 2320, so as to be conjointly rotatable with the upper chamber wall 2140. Each outlet 2124 is oriented so as to direct processing fluids exiting such outlet 2124 through fluid passages 2364 against an inner surface 2362 of the annular skirt 2360. The inner surface 2362 is flared outwardly and downwardly, as shown, so as to cause processing fluids reaching the inner surface 2362 to flow outwardly and downwardly toward the plenum 2320, under the influence of centripetal acceleration when the reactor is rotated. Thus, processing fluids tend to be swept through the plenum 2320, toward the drains 2322.

The rotor 2210 has a ribbed surface 2215 facing and closely spaced from a smooth surface 2202 of the rotor 2210, in an annular region 204 communicating with the plenum 2320. When the rotor 2210 rotates, the ribbed surface 2215 tends to cause air in the annular region 2204 to swirl, so as to help to sweep processing fluids through the plenum 2320, toward the drains 2322.

The upper chamber wall 2120 has spacers 2128 that project downwardly to prevent the lifting of a supported wafer 10 from the processing position and from touching the upper chamber wall 2120. The lower chamber wall 2140 has spacers 2148 that project upwardly for spacing a supported wafer 10 above the lower chamber wall 140 by a given distance, and posts 2150 projecting upwardly beyond the outer perimeter 16 of a supported wafer 10 for preventing the supported wafer 10 from shifting off center from the vertical axis A.

The lower chamber wall 2140 may mount a lifting mechanism 2400 for lifting a wafer 10 supported in the processing position to an elevated position. The lifting mechanism lifts the wafer 10 to the elevated position when the head 2200 is raised above the base 2300 so as to open the upper and lower chamber walls 2120, 2140. Lifting a supported wafer 10 to the elevated position facilitates its being unloaded by a loading and unloading mechanism (not shown) such as a robotic arm having an end effector.

The lifting mechanism 2400 includes an array of lifting levers 2420. Each lifting lever 2420 is mounted pivotably to the lower chamber wall 2140 via a pivot pin 2422 extending from such lifting lever 2420 into a socket 2424 in the lower chamber wall 2140, so as to be pivotable between an operative position and an inoperative position. Each pivoting lever 2420 is arranged to be engaged by the upper chamber wall 2120 when the upper and lower chamber walls 2120, 2140, are closed, whereby such pivoting lever 2420 is pivoted into the inoperative position. Each lifting lever 2420 is biased, as described below, so as to pivot into the operative position when not engaged by the upper chamber wall 2120.

Thus, each lifting lever 420 is adapted to pivot from the operative position into the inoperative position as the upper and lower chamber walls 2120, 2140, are closed, and is adapted to pivot from the inoperative position into the operative position as the upper and lower chamber walls 2120, 2140, are opened. Each lifting lever 2420 mounts a pin 2424, which extends beneath a wafer 10 supported in the processing position and lifts the supported wafer to the elevated position, when such lifting lever 2420 is pivoted from the inoperative position into the operative position.

The lifting levers 2420 may be biased by an elastic member 2440 (e.g. O-ring) surrounding the lower chamber wall 2140 and engaging the lifting levers 2420, via a hook 2426 depending from each lifting lever 2420. On each lifting lever 2420, the pin 2422 defines an axis, relative to which the pin 2424 and the hook 2426 are opposed diametrically to the each other. The elastic member 2440 is maintained under comparatively higher tension when the upper and lower chamber walls 2120, 2140, are closed, and under comparatively lower tension when the upper and lower chamber walls 2120, 2140, are opened.

The upper and lower chamber walls 2120, 2140, may also be releasably clamped to each other when in the closed state by a latching mechanism 2500. In accordance with one embodiment, the latching mechanism, the latching mechanism includes a latching ring 2520 that is retained by the lower chamber wall 2140 and that is adapted to engage a complementary shaped recess 2540 disposed in the upper chamber wall 2120. The latching ring 2520 is made from a resilient spring material (e.g. polyvinylidine fluoride) with an array of inwardly stepped portions 2530. Thus stepped portions 2530 enable the latching ring 2520 to deform from an undeformed condition in which the latching ring 2520 has a first diameter into a deformed condition in which the latching ring 2520 has a comparatively smaller diameter. Such deformation occurs when the stepped portions 2530 are subject to radial inward directed forces. Upon removal of the forces, the latching ring 2520 returns to the undeformed.

The latching mechanism 2500 further includes an array of latching cams 2540, each associated with a respective one of the stepped portions 2530. Each latching cam 2540 is adapted to apply radial forces to the respective stepped portions 2530.

The latching mechanism 2500 further includes an actuating ring 2560, which is adapted to actuating the latching cams 540 as the actuating ring 2560 is raised and lowered within a predetermined limited range of movement. In the illustrated embodiment, the actuating ring 2560 is adapted, when raised, to actuate the latching cams 2540, and, when lowered, to deactivate the latching cams. The latching mechanism 2500 further includes an array of pneumatic devices 2580 (e.g. three such devices) which are adapted to raise and lower the actuating ring 2560. When the actuating ring 2560 is raised, the upper and lower chamber walls 2120, 2140, are released from each other so that the head 2200 can be raised from the base 2300 for opening the upper and lower chamber walls 2120, 2140, or lowered onto the base 2300 for closing the upper and lower chamber walls 2120, 2140.

The actuating ring 2560 mounts upwardly projecting pins 2562 (one shown) that project into respective ones of multiple apertures 2564 in an aligning ring 2570 when the actuating ring 2560 is raised. The aligning ring 2570 is mounted to rotate conjointly with the lower chamber wall 2140. The pins 2562 are withdrawn from the apertures 2564 and clear the aligning ring 2570 when the actuating ring 2560 is lowered. When projecting into the respective apertures 2564, the pins 2562 align a wafer 10 that had been supported in the processing position so as to facilitate unloading the wafer 10 via a robotic system, as mentioned above.

D. Preferred Embodiments of the Processes and Solutions

The reactor illustrated and described above may be employed to practice the processes provided by this invention for treating a semiconductor wafer having a front, device side, a back, non-device side, and an outer perimeter (i.e., the peripheral edge), so as to remove a bulk metal or oxide thin film, such as a copper film, or metal ion or oxide contamination from selected surfaces. The wafer is suitably placed into the reactor with its back side being the lower side (or in the opposing configuration for a differently configured reactor). An etchant capable of removing the copper is used as the processing fluid. The etchant is delivered by a pump to the lower chamber. An inert gas purge is preferably used as the processing fluid that is concurrently supplied and enters the upper chamber. The supply of an inert gas purge or an aqueous rinse, such as deionized water, is preferred to insure no vapor or etchant intrusion onto the majority of the first side (excluding the edge perimeter). However, the supply of fluid to the front side is not necessary, particularly for front sides coated with an exterior layer that is not vulnerable to etchant vapor, or from which a partial amount of film can be etched without a detrimental effect to the underlying layers. The etchant is caused to flow over the back side, over an outer perimeter of the silicon wafer, and over an outer margin (the exclusion zone) of the front side, but is prevented from flowing over the remainder of the front side except for the outer margin. After the etchant removes the thin film, any residual etchant is rinsed away, as with deionized water.

The processing fluid can suitably be a mixture of an acid and an oxidizing agent.

If the thin film is a metal film, such as a copper film, a preferred etchant is a mixture of hydrofluoric acid and hydrogen peroxide, as an oxidizing agent. Preferably the solution includes 0.4 to 0.6 volume % HF, most preferably 0.5% HF, and 5 to 15% $H_2O_2$, most preferably 10 volume % $H_2O_2$, with the balance being deionized water. An alternative reagent is approximately 10% to 25% sulfuric acid with 5% to 15% hydrogen peroxide. An $HF/H_2O_2$ solution is preferred for stripping metal from wafers treated with a silicon nitride protective layer, which $HF/H_2O_2$ and $H_2SO_4/H_2O_2$ solutions are useful in stripping metal contamination from thermal oxide (silicon oxide) protective layers. Other concentrations of sulfuric acid from approximately 5% to approximately 98%, along with approximately 0% to 20% of an oxidizing agent, can be instead used to remove a metal film, such as a copper film.

The processing fluid can also be a mixture of sulfuric acid and ammonium persulfate. Other alternative enchants that can be instead used to remove a metal film, such as a copper film, include mixtures of hydrofluoric acid and a surfactant, mixtures of hydrofluoric and hydrochloric acids, mixtures of nitric and hydrofluoric acids, and EKC 5400, which is a proprietary chemical available commercially from EKC of Hayward, Calif. Mixtures of HF and HCL are suitably supplied as 0.4 to 0.6% HF and 5% to 15% HCL in deionized water. Mixtures of $HNO^3$ and HF are suitably supplied as 0.4 to 0.6% HF and 5% to 15% HCL in deionized water.

In place of hydrogen peroxide in the above etchant solutions, other oxidizers capable of etching metal films may be utilized. Dissolved ozone ($O_3$) has been found suitable for use in the above solutions in place of hydrogen peroxide, and is preferred due to its limited duration of solubility in water, such that after treatment the ozone breaks down and leaves a less hazardous waste fluid. Thus for example a suitable etchant solution for removal of metal films, such as copper films, includes 0.4 to 0.6% HF, most preferably 0.5% HF, and 10 parts per million ozone to an ozone saturated solution, preferably 20 parts per million ozone, in deionized water. When utilizing ozone as an oxidizer, apparatus used in carrying into the invention suitably include a mixing chamber into which ozone is introduced to the solution, such as through sparging ozone gas through the solution. In addition to HF/Ozone solutions, ozone may also be included as the oxidizer, in place of $H_2O_2$, in the other solutions described above, such as the sulfuric acid solutions.

The exact etchant solution to be utilized will be selected, based on the disclosure contained herein, for use with a particular film. Turning to a specific application of the processes of the present invention, treatment of the back side and bevel edge of a wafer for removal of copper contamination will be described in further detail. A preferred process sequence for a semiconductor wafer includes initially laying down a PVD or CVD barrier/adhesion layer onto the acidic wafer, followed by application of a seed layer of a metal onto the barrier layer to support subsequent deposition. The wafer is then subjected to electrochemical deposition to deposit the desired conductive film of copper over the front (device) side of the wafer, possibly excluding the outer perimeter of the substrate from the deposition, or potentially depositing copper to the edge and over the bevel of the wafer.

The wafer is then placed into a reaction chamber to perform a controlled etch of the back side, bevel edge, end of the seed layer metal and/or electroplated metal on the front side within a controlled distance from the perimeter edge of the substrate, to define a distinct exclusion zone from which copper has been removed by the etchant. Alternately, etchant may be supplied to remove metal from only the back side and bevel edge of the wafer, or to just remove metal contaminant from the back side of the wafer. The various process configurations will be described in terms of a process for exposing the back side, bevel edge and controlled perimeter edge exclusion zone to etchant, but it should be understood that any of these variations are possible.

After placement of the wafer in the etchant chamber, the chamber spins until it reaches a desired processing rotational speed, at which point any residual plating solution is rinsed from the front side of the wafer using deionized water. After rinsing, an inert gas stream is preferably (but not necessarily) supplied to the front (device) side of the wafer, while an etchant solution is delivered to the back side of the wafer. The etchant solution, such as use of the $HF/H_2O_2$ or $H_2SO_4$ $H_2O_2$ solutions disclosed above, is delivered at a concentration level and for a sufficient period of time to achieve the desired level of removal of copper ions from the back side and bevel, as well as the front side exclusion zone. After cleaning of the back side and etching of the bevel and front side exclusion zone in this fashion, the wafer is rinsed with deionized water on both sides, spun to remove liquid, and then dried with inert gas such as heated nitrogen. The following tables I and II illustrate suitable sets of process steps to achieve this back side cleaning and bevel etching:

TABLE I

Suitable Cu Backside Clean and Bevel Etch Recipes

| Step | Description | Time | D1 | $N_2$ | Chem. |
|---|---|---|---|---|---|
| 1 | Rinse 1 | 0:10–0:30 | Front | | |
| 2 | Spin off | 0:05 | | Front | |
| 3 | Etch | 0:20–0:40 (preferably 0:30) | | Front | Back |
| 4 | Rinse 2 | 0:10–0:30 | Front, Back | | |
| 5 | Purge | 0:05 | Front, Back | Front, Back | |
| 6 | Rinse 3 | 0:10–0:30 | Front, Back | | |
| 7 | Dry | 0:60 | | Front, Back | |

TABLE II

Suitable Cu Backside Clean and Bevel Etch Recipe

| Step | Description | Time | Supply |
|---|---|---|---|
| 1 | Etch/process | 0:20–0:60 | Chemical to one or both sides; N2 alternate |
| 2 | Rinse | 0:10–0:30 | D1 rinse to front and back |
| 3 | Dry | 0:30–0:60 | N2 Purge to front and back; dry |

The above sequence times and sequence steps are provided by way of example only, and are not intended to limit the invention. Other sequence arrangements, such as single rather than multiple rinses, and rinsing or etching for different periods of time, are also within the scope of the present invention.

Figure 30:
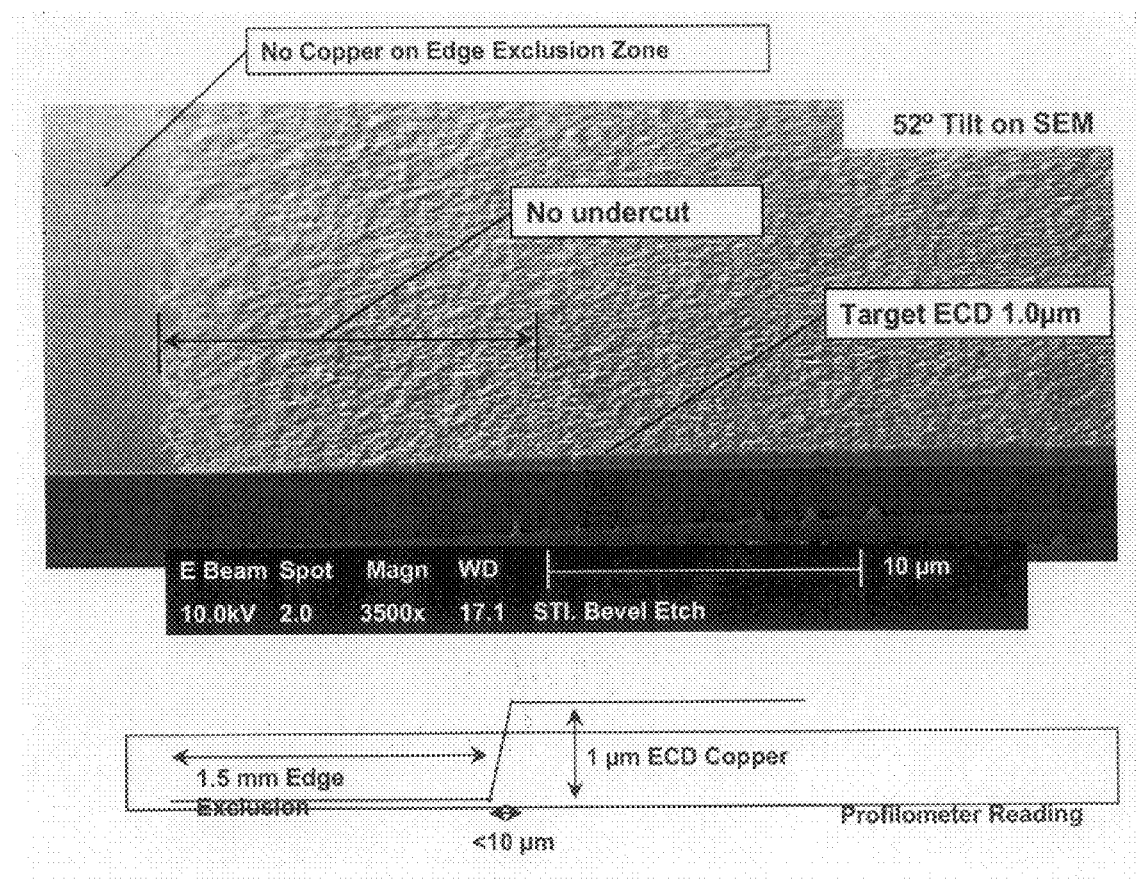
FIG. 30 provides an SEM photo of a perimeter edge portion of a wafer processed in accordance with the present invention.

Use of a diluted sulfuric acid and peroxide solution, including approximately 10 parts $H_2SO_4$ to thirty parts $H_2O_2$ in deionized water, for an etchant exposure of approximately 30 seconds, results in removal of copper films of less than approximately 1.5 microns and achieves a back side clean of less than or equal to 5–10 copper atoms/cm$^2$. FIG. 30 provides a scanning electron microscope photo of the exclusion zone formed on the front side of a wafer treated in accordance with this process, yielding a clean etch exclusion zone (as well as clean bevel edge and back side (not shown)), and a distinct demarcation between the exclusion zone and the substantially unaffected copper film on the remainder of the front side.

Figure 31:
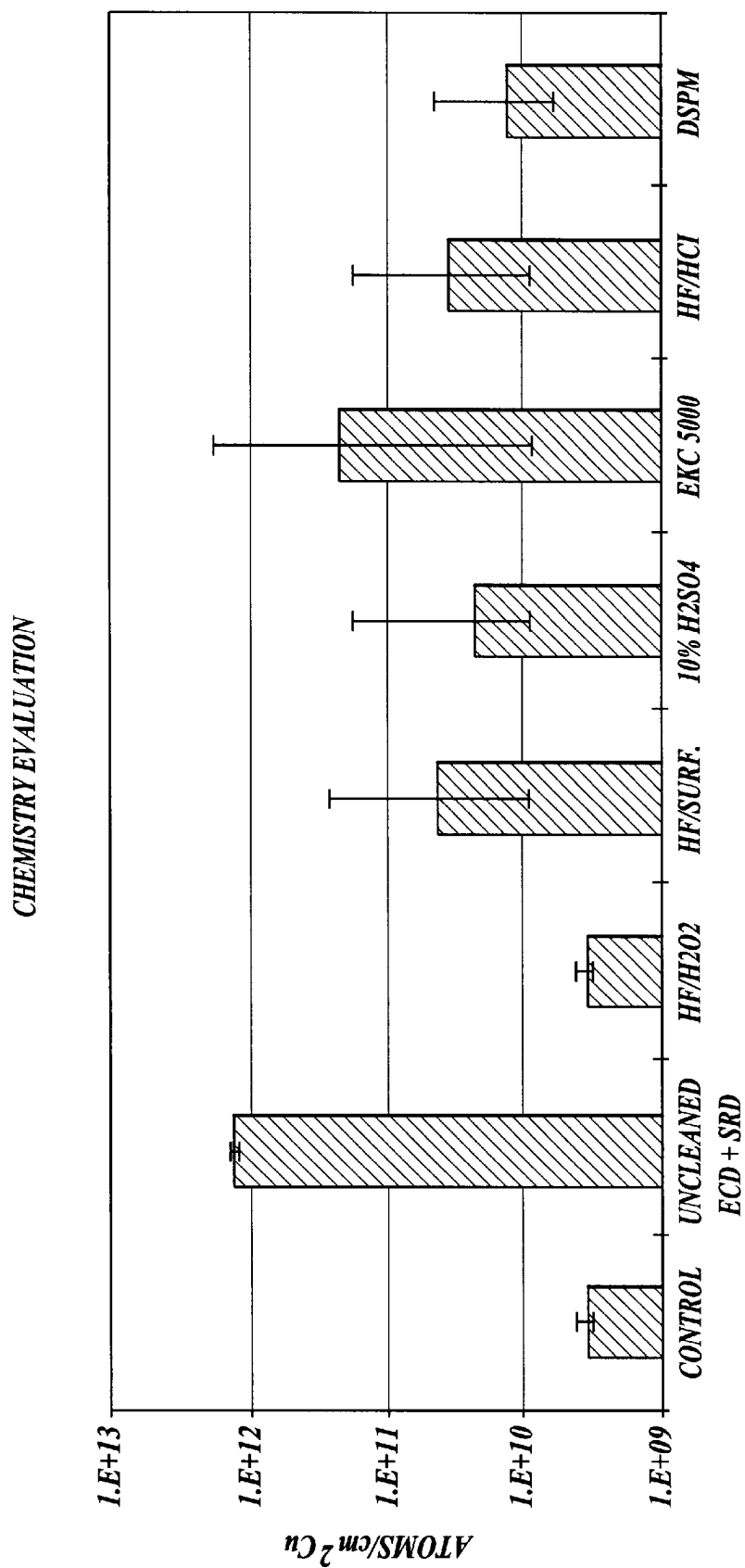
FIG. 31 provides etching results for various chemistries useful as processing fluids in the present invention.

While the specific example above uses a dilute sulfuric acid and hydrogen peroxide solution, as noted above other solutions are suitably used. FIG. 31 provides results for use of various solutions on test wafers prepared by treating the polished side of bare silicon wafers with an acid copper solution. The acid copper solution was then rinsed from the wafer, and then the back side was cleaned and the edge bevel etched in accordance with the processes and apparatus of the present invention. Post cleaning analysis was done using a TXRF detector, with detection limits being roughly $7–9E^{10}$ atoms per centimeter square. FIG. 31 provides comparative post-processing copper residues for an untreated wafer ("control"), for the acid-copper treated wafer ("uncleaned ECD+SRD"), and various etchant solutions. Specimens showing a post cleaning copper contamination level of less than $1E^{11}$ atoms were judged to be suitable. Specifically, cleaning with a hydrogen fluoride/hydrogen peroxide solution was found to yield cleaning at a level equal to that of an uncontaminated control specimen, while cleaning with a dilute sulfuric acid etchant, sulfuric acid/hydrochloric acid solutions, and DSPM (dilute sulfuric acid/hydrogen peroxide) solutions were also found to yield suitable results. The exact solution utilized will be selected in accordance with compatibility for other films on the substrate and other process solutions.

The above examples illustrate the use of the processes of the present invention for cleaning copper contamination from the back side of a semiconductor wafer, and for etching copper from the bevel edge and front side exclusion zones. However, other processes are also suitably carried out, and involve common steps of rinsing the wafer to clear it of any residual chemistry from prior processing steps if necessary, followed by etching the wafer with a suitable etchant solution, followed by post etch rinsing such as with deionized water, spinning to remove solution, and then dying such as with heated inert gas.

One such further example entails the removal of trace amounts of cobalt from the back side of a wafer, and unreactive cobalt from the front side of the wafer, after cobalt processing. Specifically, after a wafer has been treated with cobalt to form contact points on the front device side, such as by sputtering cobalt (physical vapor deposition) onto the front side, the front side of the wafer includes both cobalt silicides where the cobalt has contacted bare silicon, and unreacted cobalt where the cobalt has contacted an oxide coating. Processes of the present invention may be utilized to remove this unreacted cobalt from the front side, as well as to remove any cobalt contaminant from the back side (and potentially the bevel edge). In this instance, both front and back side are preferably exposed to treatment solutions.

The preferred cobalt etching process entails first rinsing the front and back sides of the wafer. A diluteulfuric acid/hydrogen peroxide solution, as disclosed above, is then sprayed or otherwise applied onto both sides of the wafer, The preferred cobalt etching process entails first rinsing the front and back sides of the wafer. A dilute sulfuric acid/hydrogen peroxide solution, as disclosed above, is then sprayed or otherwise applied onto both sides of the wafer, concurrently, to remove unreacted cobalt. A suitable dilution for the solution is one part sulfuric acid to 10–20 parts hydrogen peroxide. After exposing both sides to this dilute sulfuric acid solution for a suitable period of time to achieve a predetermined level of cobalt removal, both sides are exposed to a further deionized water rinse. Thereafter, the back side only of the wafer is exposed to a hydrofluoric acid solution (such as 200 parts deionized water to one part HF), to remove a portion of the protective cap of oxide layer present on the back side of the wafer, which typically has an amount of cobalt diffused thereinto. The entire oxide layer is not removed, but just a predetermined amount of the oxide layer as required to remove the cobalt contamination. The front side of the wafer is preferably supplied with an inert nitrogen gas concurrent to back side treatment with hydrofluoric acid. Both sides of the wafer are then rinsed and dried. Treatment requirements for the present invention will yield a removal of cobalt with less than $1E^{10}$ as measured with total x-ray fluorescent detection. While the supply of nitrogen to the front side has been described and is preferred in order to exclude hydrofluoric acid vapor from the front side, it is not strictly necessary. Similarly, wafers with films of Pt, Pd, BST, SBT, Ru, and Ir can be processed using suitable etchants.

A further example of a process in accordance with the present invention is the cleaning of the back side of a semiconductor wafer prior to photo lithographic treatment. If particulate contamination is present on the back side of a semiconductor wafer, high spots, referred to as hotspots, can be formed on the front side of the wafer during further lithographic treatment due to the wafer sitting at an uneven degree of tilt. Prior to photo resist application, the wafer can be treated in accordance with the present invention to remove particulates and other contaminants from the backside. This process suitably is carried out by rinsing both sides of the wafer, followed by exposure of the back side only to a suitable etchant solution such as hydrofluoric acid/ozone, hydrofluoric acid/hydrogen peroxide, sulfuric acid/hydrogen peroxide or hydrochloric acid/hydrogen peroxide, as previously described above. Optionally, the front side of the wafer may be supplied with nitrogen gas at the same time as cleaning of the back side. The present invention insures that the front side is not contaminated with the cleaning solutions during the cleaning of the back side. A still further example of a process for use in the present invention is removal of dry etch residue material after patterning of a wafer. Specifically, when the front side of a wafer has been etched with a dry plasma etch, a residue consisting of materials being etched or removed from the substrate surface, gas etch residue or metallization and dielectric layer residue remains on the front side of a wafer. Conventionally, this residue is removed using a solvent to which the wafer must be exposed for a long period of time, often in an excess of 60 minutes, at elevated temperatures. In accordance with the present invention, wafers may be suitably treated at ambient temperatures, e.g., 23° C., for relatively short process times of approximately one minute in length or less, using commercially available dry etch residue removal solutions such as EKC 640 and Ashland NE 89, which are believed to be hydrofluoric acid or ammonium fluoride based solutions. EKC 640 is available from EKC Corporation, while Ashland NE 89 as available from the Ashland Corporation. The process entails rinsing and then exposing the front side of the wafer to the solvent, and then rinsing and drying both sides. Typically it is not necessary to treat the back side, which has not been contaminated during the dry etching process.

It is noted that the above processes for cleaning the back side to remove particulate contamination prior to photo lithography, and the front side to remove dry etch residue, may be carried out concurrently in a reactor in accordance with the present invention.

Other processes are also included with the scope of the present invention, such as etching oxides on one or both sides of the wafer, concurrently or separately.

The present invention reduces the size of the annular exclusion zone on the front side of the wafer, which region is not available for fabricating interconnect structures and/or metallized components (see FIG. 2). All other dimensions being alike, the present invention, when used for bevel edge and front side exclusion zone cleaning, increases the surface area of a wafer available for fabricating interconnect structures and/or metallic components. It follows that this invention enables a greater yield of microelectronic devices from a silicon wafer of a given size. Advantageously, the process provided by this invention not only removes a thin film, such as a copper film, but also removes any contaminant, such as any copper or other metal, that the reagent is capable of solvating from the back side of the silicon wafer.

The thin film removed by the process of the present invention could also be substantially comprised of silicon nitride, silicone oxide or polysilicon.

The present invention has been illustrated with respect to a wafer. However, it will be recognized that the present invention has a wider range of applicability. By way of example, the present invention is applicable in the processing of disks and heads, flat panel displays, microelectronic masks, and other devices requiring effective and controlled wet processing. While the preferred embodiment of the invention has been illustrated and described, it will be appreciated that various changes can be made therein without departing from the spirit and scope of the invention.

The embodiments of the invention in which an exclusive property or privilege is claimed are defined as follows:

1. A process for treating a semiconductor workpiece having a front side on which a plurality of metallized devices are formed, an opposing back side and a peripheral edge defined between the front and back sides, the back side and/or peripheral edge being contaminated with metal ions, comprising:
   (a) placing the semiconductor workpiece in a reaction chamber;
   (b) supplying a first fluid to the chamber to expose the back side to the first fluid while excluding at least a major portion of the front side from exposure to the first fluid;
   (c) wherein the first fluid is supplied for a sufficient time period to remove at least a portion of the contaminant metal ions from the back side of the workpiece and said first fluid comprises an aqueous etchant solution comprised of an acid selected and supplied at a concentration level sufficient to remove at least a portion of the contaminant metal ions from the back side of the workpiece; and
   (d) supplying a second fluid to the chamber to expose the front side to the second fluid.

2. The process of claim 1, wherein the first and second fluids are supplied concurrently to the back and front sides, respectively, of the workpiece.

3. The process of claim 1, wherein the first and second fluids are supplied at different time periods.

4. The process of claim 1, further comprising exposing the peripheral edge of the workpiece to the first fluid.

5. The process of claim 4, further comprising exposing the outer perimeter edge portion of the back side to the first fluid.

6. The process of claim 1, wherein the second fluid comprises a fluid that is different from the first fluid.

7. The process of claim 1, wherein the second fluid comprises an inert purge gas or an aqueous rinse.

8. A process for treating a semiconductor workpiece having a front side on which a plurality of metallized devices are formed, an opposing back side and a peripheral edge defined between the front and back sides, the back side and/or peripheral edge being contaminated with metal ions, comprising:
   (a) placing the semiconductor workpiece in a reaction chamber;
   (b) supplying a first fluid to the chamber to expose the back side to the first fluid while excluding at least a major portion of the front side from exposure to the first fluid;
   (c) wherein the first fluid is supplied for a sufficient time period to remove at least a portion of the contaminant metal ions from the back side of the workpiece and said first fluid comprises an aqueous etchant solution comprised of an acid selected and supplied at a concentration level sufficient to remove at least a portion of the contaminant metal ions from the back side of the workpiece;
   (d) supplying a second fluid to the chamber to expose the front side to the second fluid; and
   (e) wherein the reaction chamber comprises a first chamber portion and a second chamber portion that are defined by separable first and second reactor members that cooperatively support the workpiece.

9. The process of claim 8, wherein the first and second reactor members are spun together on a common axis during the supplying of the first and second fluids to the workpiece.

10. The process of claim 8, further comprising spinning the reactor chamber and workpiece while supplying the first fluid to etch the surface portion of the workpiece.

11. A process for treating a semiconductor workpiece having a front side on which a plurality of metallized devices are formed, an opposing back side and a peripheral edge defined between the front and back sides, the back side and/or peripheral edge being contaminated with metal ions, comprising:
   (a) placing the workpiece in a reaction chamber that includes a first chamber portion that receives the back side and including a first fluid inlet and a second chamber portion receiving the front side and including a second fluid inlet;
   (b) supplying a first fluid to the first chamber portion to expose the back side to the first fluid while excluding at least a major portion of the front side from exposure to the first fluid; and
   (c) wherein the first fluid is supplied for a sufficient time period to remove at least a portion of the contaminant metal ions from the back side of the workpiece and said first fluid comprises an aqueous etchant solution which comprises an acid selected and supplied at a concentration level sufficient to remove the contaminant metal ions from the back side of the workpiece.

12. A process for treating a semiconductor workpiece having a front side on which a plurality of metallized devices are formed, an opposing back side and a peripheral edge defined between the front and back sides, the back side and/or peripheral edge being contaminated with metal ions, comprising:
   (a) placing the workpiece in a reaction chamber that includes a first chamber portion that receives the back side and including a first fluid inlet and a second chamber portion receiving the front side and including a second fluid inlet;
   (b) supplying a first fluid to the first chamber portion to expose the back side to the first fluid while excluding at least a major portion of the front side from exposure to the first fluid;
   (c) wherein the first fluid is supplied for a sufficient time period to remove at least a portion of the contaminant metal ions from the back side of the workpiece and said first fluid comprises an aqueous etchant solution which comprises an acid selected and supplied at a concentration level sufficient to remove the contaminant metal ions from the back side of the workpiece; and
   (d) wherein the first chamber portion and the second chamber portion are defined by separable first and second reactor members that cooperatively support the workpiece.

13. The process of claim 12, wherein the first and second reactor members are spun together on a common axis during the supplying of the first and second fluids to the workpiece.

14. The process of claim 12, further comprising spinning the reactor chamber and workpiece while supplying the first fluid to etch the surface portion of the workpiece.

15. A process for treating a semiconductor workpiece having a front side on which a plurality of metallized devices are formed, an opposing back side and a peripheral edge defined between the front and back sides, the back side and/or peripheral edge being contaminated with copper ions, comprising:
   (a) placing the semiconductor workpiece in a reaction chamber that includes a first chamber portion that receives the back side of the workpiece and a second chamber portion that receives the front side of the workpiece;
   (b) supplying a first fluid to the first chamber portion to expose the back side to the first fluid while excluding at least a major portion of the front side from exposure to the first fluid;
   (c) wherein the first fluid is supplied for a sufficient time period and comprises an aqueous etchant solution which comprises an acid selected and supplied at a concentration level sufficient to remove at least a portion of the contaminant copper ions from the back side of the workpiece; and
   (d) supplying a second fluid to the second chamber portion to expose the front side to the second fluid.

16. A process for treating a semiconductor workpiece having a front side on which a plurality of metallized devices are formed, an opposing back side and a peripheral edge defined between the front and back sides, the back side and/or peripheral edge being contaminated with copper ions, comprising:
   (a) placing the workpiece in a reaction chamber that includes a first chamber portion that receives the back side and including a first fluid inlet and a second chamber portion receiving the front side and including a second fluid inlet;
   (b) supplying a first fluid to the first chamber portion to expose the back side to the first fluid while excluding at least a major portion of the front side from exposure to the first fluid; and
   (c) wherein the first fluid is supplied for a sufficient time period and comprises an aqueous etchant solution which comprises an acid selected and supplied at a concentration level sufficient to remove at least a portion of the contaminant copper ions from the back side of the workpiece.

17. A process for treating a semiconductor workpiece having a front side on which a plurality of metallized devices are formed, an opposing back side and a peripheral edge defined between the front and back sides, the back side and/or peripheral edge being contaminated with metal ions, comprising:

(a) placing the semiconductor workpiece in a reaction chamber;

(b) supplying a first fluid to the chamber to expose the back side to the first fluid while excluding at least a major portion of the front side from exposure to the first fluid;

(c) wherein the first fluid is supplied for a sufficient time period to remove at least a portion of the contaminant metal ions from the back side of the workpiece and said first fluid comprises an aqueous etchant solution comprised of:

(a1) an acid, selected and supplied at a concentration level sufficient to remove at least a portion of the contaminant metal ions from the back side of the workpiece, and (b1) an oxidizing agent; and (d) supplying a second fluid to the chamber to expose the front side to the second fluid.

18. The process of claim 17, wherein the aqueous etchant solution is selected from the group consisting of:

(a2) hydrofluoric acid and hydrogen peroxide, (b2) hydrofluoric acid and ozone in an aqueous solution, (c2) sulfuric acid and hydrogen peroxide, (d2) hydrofluoric acid and hydrochloric acid, and (e2) nitric acid and hydrofluoric acid.

19. The process of claim 18, wherein the hydrofluoric acid is included at a level of 0.4 to 0.6 volume % and the hydrogen peroxide is included at a level of 5.0 to 15.0 volume %.

20. The process of claim 18, wherein the hydrofluoric acid is included at a level of 0.4 to 0.6 volume % and the ozone is present in solution at a level of from 10 parts per million to an ozone saturated solution.

21. A process for treating a semiconductor workpiece having a front side on which a plurality of metallized devices are formed, an opposing back side and a peripheral edge defined between the front and back sides, the back side and/or peripheral edge being contaminated with copper ions, comprising:

(a) placing the workpiece in a reaction chamber that includes a first chamber portion that receives the back side and including a first fluid inlet and a second chamber portion receiving the front side and including a second fluid inlet;

(b) supplying a first fluid to the first chamber portion to expose the back side to the first fluid while excluding at least a major portion of the front side from exposure to the first fluid;

(c) wherein the first fluid is supplied for a sufficient time period and comprises an aqueous etchant solution which comprises an acid selected and supplied at a concentration level sufficient to remove at least a portion of the contaminant copper ions from the back side of the workpiece; and (d) wherein the etchant comprises:

(a1) an acid, selected and supplied at a concentration level sufficient to remove at least a portion of the contaminant copper ions from the back side of the workpiece, and (b1) an oxidizing agent.

22. The process of claim 21, wherein the etchant is selected from the group consisting of:

(a2) hydrofluoric acid and hydrogen peroxide, (b2) hydrofluoric acid and ozone in an aqueous solution, (c2) sulfuric acid and hydrogen peroxide, (d2) hydrofluoric acid and hydrochloric acid, and (e2) nitric acid and hydrofluoric acid.

23. The process of claim 22, wherein the hydrofluoric acid is included at a level of 0.4 to 0.6 volume % and the hydrogen peroxide is included at a level of from 5.0 to 15.0 volume %.

24. The process of claim 22, wherein the hydrofluoric acid is included at a level of from 0.4 to 0.6 volume % and the ozone is present in solution at a level of from 10 parts per million to an ozone saturated solution.

* * * * *

UNITED STATES PATENT AND TRADEMARK OFFICE
CERTIFICATE OF CORRECTION

PATENT NO. : 6,632,292 B1
DATED : October 14, 2003
INVENTOR(S) : B.K. Aegerter et al.

It is certified that error appears in the above-identified patent and that said Letters Patent is hereby corrected as shown below:

Title page,
Item [75], Inventor, "Kila, MT" should read -- Loveland, CO --

Title page,
Item [63], Related U.S. Application Data, "Continuation of application No. 09/437,926," should read -- Continuation-in-part of application No. 09/437,926, --
"Pat. No. 6,473,436," should read -- Pat. No. 6,413,436, --
"No. 09/113,435, filed Jul. 10, 1998, now Pat. No. 6,264,752, and continuation-in-part of application No. 09/041,901, filed Mar. 13, 1998, now Pat. No. 6,350,319." should read -- No. 09/041,649, filed Mar. 13, 1998, now Pat. No. 6,378,385, and a continuation-in-part of application No. 09/113,435, filed on Jul. 10, 1998, now Pat. No. 6,269,752, which is a continuation-in-part of application No. 09/041,901, filed Mar. 13, 1998, now Pat. No. 6,350,319. --

Column 33,
Line 24, "(a2)" should read -- (a2) --
Line 25, "(b2)" should read -- (b2) --
Line 26, "(c2)" should read -- (c2) --
Line 27, "(d2)" should read -- (d2) --
Line 28, "(e2)" should read -- (e2) --

Signed and Sealed this

Sixth Day of July, 2004

JON W. DUDAS
*Acting Director of the United States Patent and Trademark Office*